(12) United States Patent
Arakawa et al.

(10) Patent No.: US 10,957,803 B2
(45) Date of Patent: Mar. 23, 2021

(54) BIDIRECTIONAL ZENER DIODE AND METHOD FOR MANUFACTURING BIDIRECTIONAL ZENER DIODE

(71) Applicant: ROHM CO., LTD., Kyoto (JP)

(72) Inventors: Takahiro Arakawa, Kyoto (JP); Junya Yamagami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/510,344

(22) Filed: Jul. 12, 2019

(65) Prior Publication Data

US 2020/0027997 A1 Jan. 23, 2020

(51) Int. Cl.

| | |
|---|---|
| *H01L 29/866* | (2006.01) |
| *H01L 29/417* | (2006.01) |
| *H01L 29/66* | (2006.01) |
| *H01L 29/06* | (2006.01) |
| *H01L 23/00* | (2006.01) |
| H01L 21/265 | (2006.01) |
| H01L 29/861 | (2006.01) |
| H01L 23/31 | (2006.01) |

(52) U.S. Cl.
CPC ............ *H01L 29/866* (2013.01); *H01L 24/04* (2013.01); *H01L 29/0649* (2013.01); *H01L 29/0692* (2013.01); *H01L 29/417* (2013.01); *H01L 29/66106* (2013.01); H01L 21/26513 (2013.01); H01L 23/3171 (2013.01); H01L 23/3185 (2013.01); H01L 29/66098 (2013.01); H01L 29/861 (2013.01)

(58) Field of Classification Search
None
See application file for complete search history.

(56) References Cited

U.S. PATENT DOCUMENTS

| | | | |
|---|---|---|---|
| 6,015,999 A | 1/2000 | Yu et al. | |
| 2014/0284754 A1* | 9/2014 | Yamamoto | .......... H01L 23/5223 257/487 |
| 2015/0255628 A1* | 9/2015 | Yamamoto | .......... H01L 29/0692 257/603 |
| 2016/0351557 A1* | 12/2016 | Weyers | ............... H01L 29/7805 |
| 2017/0092784 A1* | 3/2017 | Yamamoto | ............ H01L 29/866 |

* cited by examiner

*Primary Examiner* — Steven B Gauthier
(74) *Attorney, Agent, or Firm* — Rabin & Berdo, P.C.

(57) ABSTRACT

A bidirectional Zener diode includes a substrate, a first conductivity type base region formed at a front surface portion of the substrate, a second conductivity type first impurity region formed at the base region, a second conductivity type second impurity region formed at the base region away from the first impurity region, an insulating layer formed on a front surface of the substrate, a first electrode film formed on the insulating layer and electrically connected to the first impurity region, and a second electrode film formed on the insulating layer and electrically connected to the second impurity region, and a first region formed on the insulating layer, the first region being sandwiched between the first electrode film and the second electrode film, and the first region including a portion having an aspect ratio of 1 or larger.

16 Claims, 21 Drawing Sheets

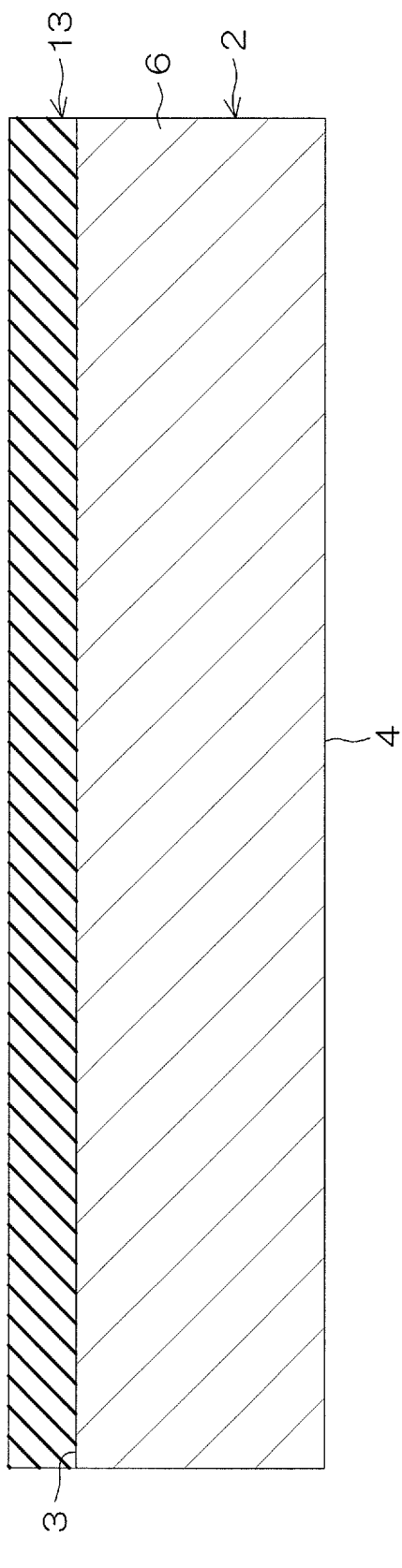

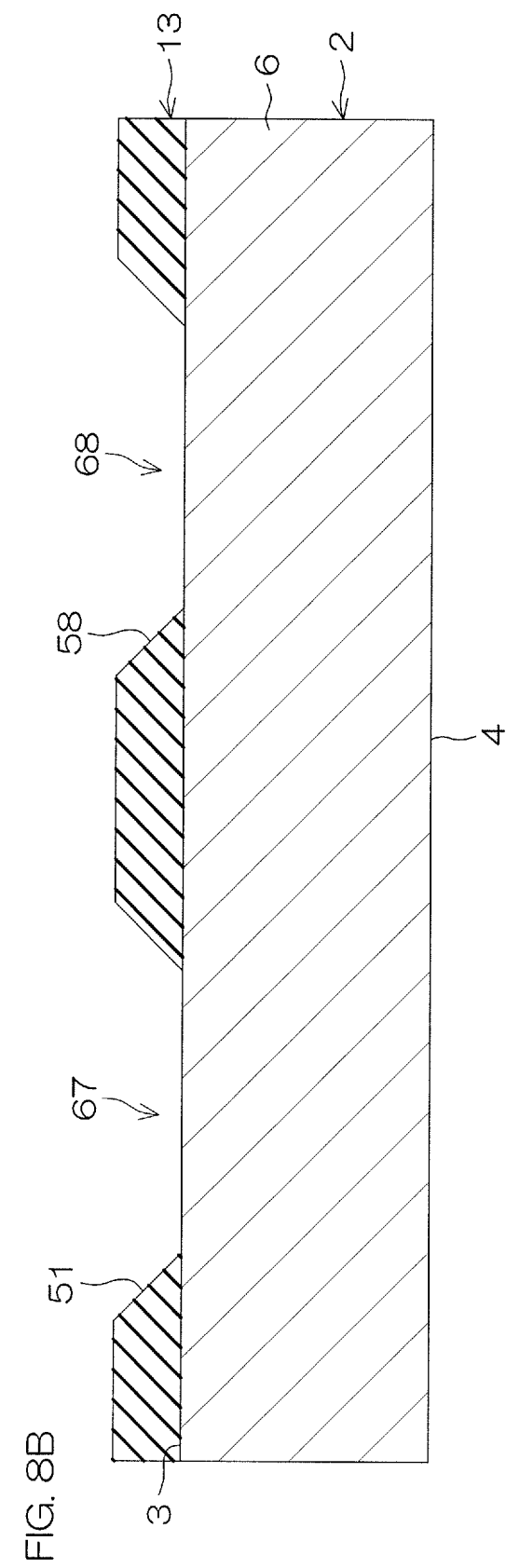

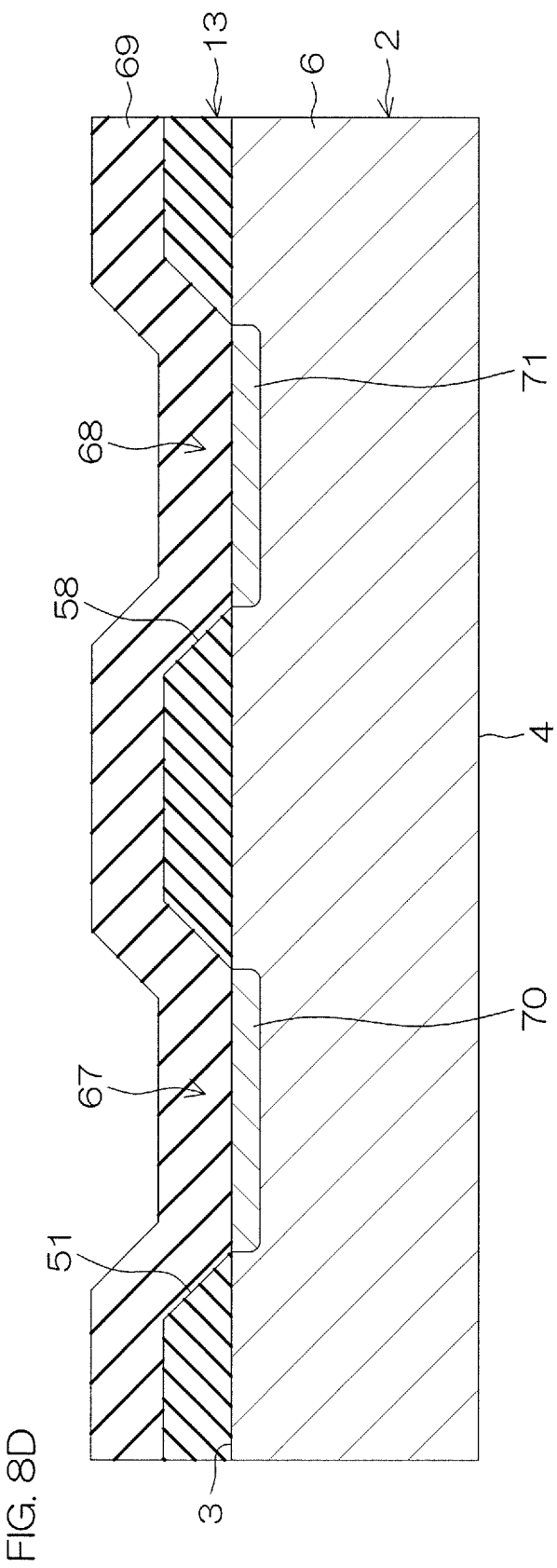

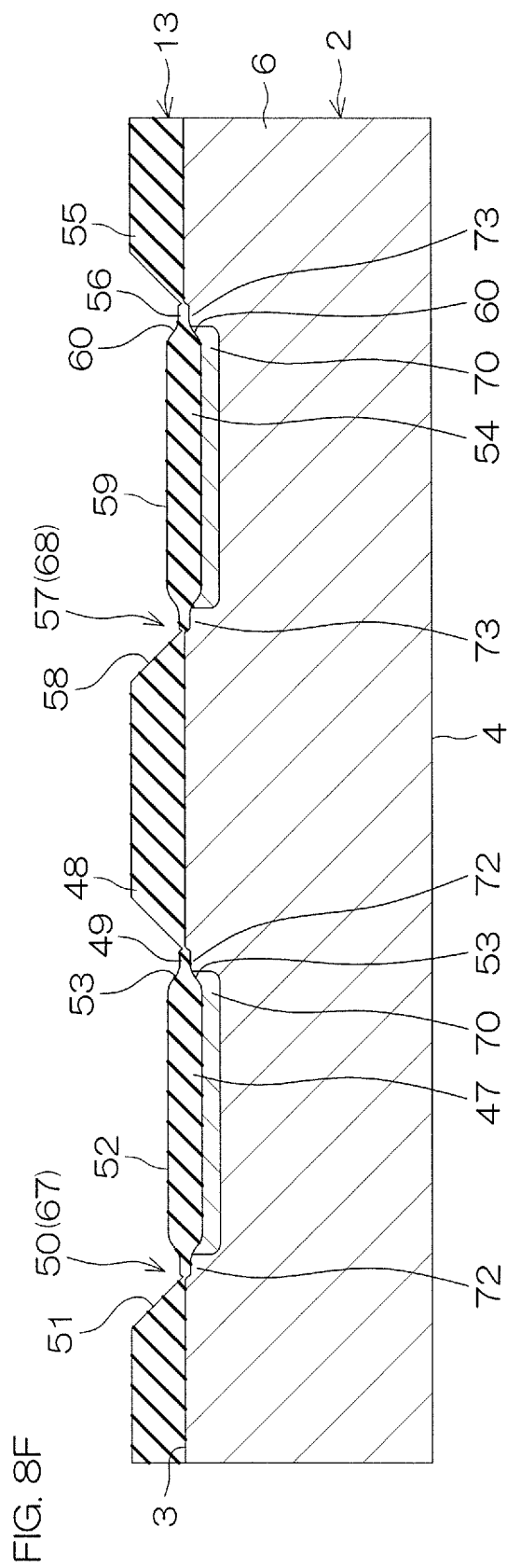

BIDIRECTIONAL ZENER DIODE AND METHOD FOR MANUFACTURING BIDIRECTIONAL ZENER DIODE

CROSS-REFERENCE TO RELATED APPLICATIONS

The present application corresponds to Japanese Patent Application No. 2018-135188 filed in the Japan Patent Office on Jul. 18, 2018, and the entire disclosure of the present application is incorporated herein by reference.

TECHNICAL FIELD

The present invention relates to a bidirectional Zener diode and a method for manufacturing the same.

BACKGROUND ART

A TVS (Transient Voltage Suppressor) element is known as an element that absorbs a transient voltage, an ESD (Electrostatic Discharge), noises, etc. The TVS element can be made up of various devices, and, in general, an element in which a pair of diodes are connected in anti-series is employed as the TVS element. One such example is disclosed in Patent Literature 1.

A diode having an nppn layered structure that includes an $n^+$ type substrate, a $p^-$ layer formed on a surface layer portion of the substrate, a $p^+$ layer formed on a surface layer portion of the p layer, and an $n^+$ layer formed on a surface layer portion of the $p^+$ layer is disclosed in Patent Literature 1 (description of U.S. Pat. No. 6,015,999).

SUMMARY OF INVENTION

Various parameters, such as reverse breakdown voltage $V_{BR}$, reverse standoff voltage $V_{rwm}$, and peak pulse power $P_{pk}$ ((=clamping voltage $V_{CL}$×peak pulse current $I_{pp}$), exist as electrical properties of a TVS element in which a pair of diodes are connected in anti-series.

Here, the present inventors have considered making a bidirectional Zener diode in which a pair of Zener diodes are connected in anti-series on a surface portion of a substrate as a TVS element, unlike the nppn layered structure of Patent Literature 1.

In view of these circumstances, the present invention aims to provide a bidirectional Zener diode that is capable of achieving more excellent electrical properties (particularly, peak pulse power $P_{pk}$) than in conventional techniques and to provide a method for manufacturing the same.

BRIEF DESCRIPTION OF DRAWINGS

FIG. 8A to FIG. 8H are views of the manufacturing process of the bidirectional Zener diode of FIG. 1 shown in order of steps.

DESCRIPTION OF EMBODIMENTS

Figure 1:
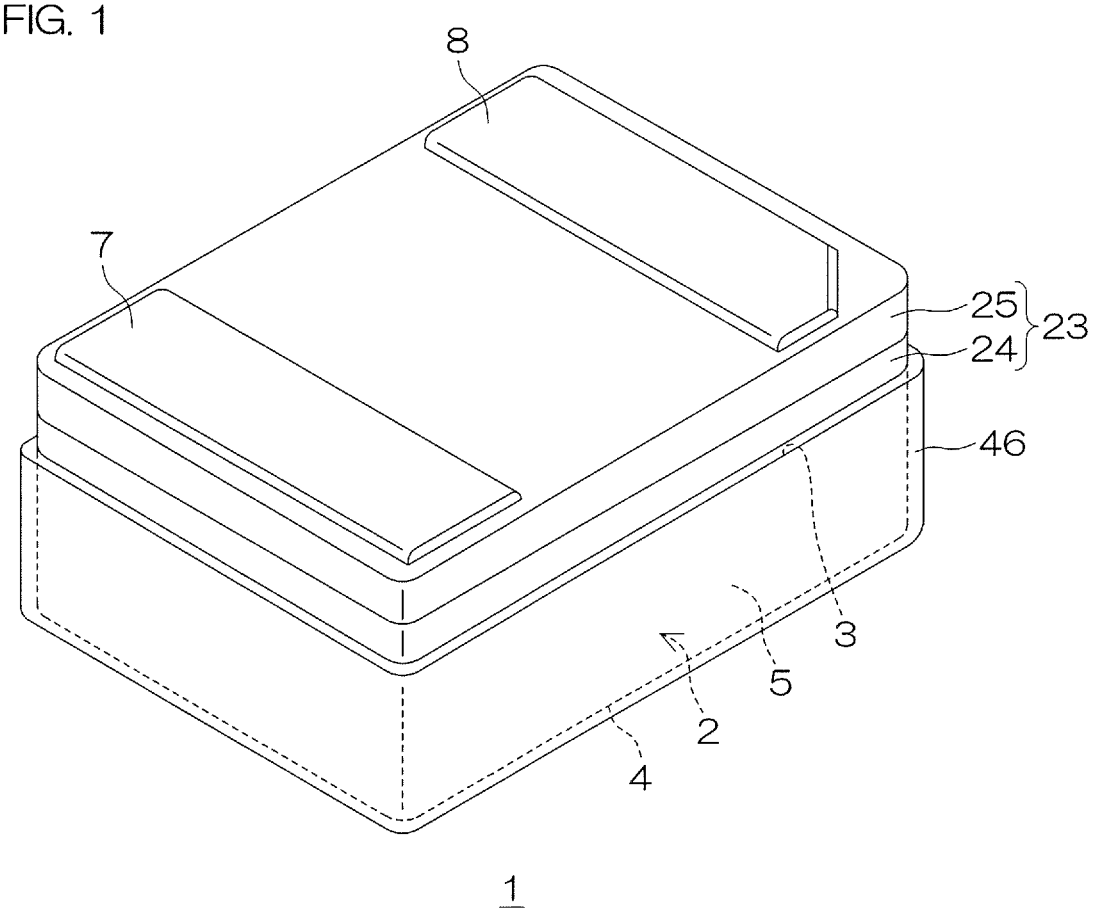
FIG. 1 is a schematic perspective view of a bidirectional Zener diode according to a preferred embodiment of the present invention.

A bidirectional Zener diode according to one preferred embodiment of the present invention includes a substrate, a first conductivity type base region formed at a front surface portion of the substrate, a second conductivity type first impurity region formed at the base region, a second conductivity type second impurity region formed at the base region away from the first impurity region, an insulating layer formed on a front surface of the substrate, a first electrode film formed on the insulating layer and electrically connected to the first impurity region, and a second electrode film formed on the insulating layer and electrically connected to the second impurity region, and, a first region formed on the insulating layer, the first region being sandwiched between the first electrode film and the second electrode film, and the first region including a portion having an aspect ratio of 1 or larger.

According to the bidirectional Zener diode according to one preferred embodiment of the present invention, the first region includes a portion whose aspect ratio is 1 or larger, and therefore a relatively thick electrode film is formed as the first electrode film and as the second electrode film. This makes it possible to restrict the resistance value of the first electrode film and the resistance value of the second electrode film to a lower value, and makes it possible to allow a large electric current to run through these electrode films. As a result, it is possible to heighten the peak pulse current $I_{pp}$ of the bidirectional Zener diode, hence making it possible to achieve excellent peak pulse power $P_{pk}$.

In the bidirectional Zener diode according to one preferred embodiment of the present invention, the first electrode film may include a first pad portion disposed away from the first impurity region in a direction along the front surface of the substrate and a first wiring portion that extends from the first pad portion to a region on the first impurity region, and the first wiring portion may have a largest first width ($W_1$) in a connection portion connected to the first pad portion.

In the bidirectional Zener diode according to one preferred embodiment of the present invention, the first wiring portion may be formed in a tapered shape so as to become gradually thinner toward a tip end portion of the first wiring portion from the connection portion connected to the first pad portion.

In the bidirectional Zener diode according to one preferred embodiment of the present invention, the largest first width ($W_1$) in the connection portion connected to the first pad portion of the first wiring portion may be twice or more a width ($W_1'$) of the tip end portion of the first wiring portion.

In the bidirectional Zener diode according to one preferred embodiment of the present invention, the second electrode film may include a second pad portion disposed away from the second impurity region in a direction along the front surface of the substrate and a second wiring portion that extends from the second pad portion to a region on the second impurity region, and the second wiring portion may have a largest second width ($W_2$) in a connection portion connected to the second pad portion.

In the bidirectional Zener diode according to one preferred embodiment of the present invention, the second wiring portion may be formed in a tapered shape so as to become gradually thinner toward a tip end portion of the second wiring portion from the connection portion connected to the second pad portion.

In the bidirectional Zener diode according to one preferred embodiment of the present invention, the largest second width ($W_2$) in the connection portion connected to the second pad portion of the second wiring portion may be twice or more a width ($W_2'$) of the tip end portion of the second wiring portion.

In the bidirectional Zener diode according to one preferred embodiment of the present invention, a thickness ($T_1$) of the first electrode film and a thickness ($T_2$) of the second electrode film may be each 3 µm to 5 µm, and a distance (D) between the first electrode film and the second electrode film in the portion having the aspect ratio (A) of the first region may be 0.5 µm to 5 µm.

In the bidirectional Zener diode according to one preferred embodiment of the present invention, the first electrode film and the second electrode film may be each made of AlCu.

In the bidirectional Zener diode according to one preferred embodiment of the present invention, the insulating layer may have a first contact hole that exposes the first impurity region, and the first electrode film may be connected to the first impurity region through the first contact hole, and the insulating layer may include a first portion that has a first thickness ($T_3$) and that forms the first contact hole and a second portion that surrounds the first portion and that has a second thickness ($T_4$) larger than the first thickness ($T_3$).

In the bidirectional Zener diode according to one preferred embodiment of the present invention, the insulating layer may include a third portion that is formed between the first portion and the second portion and that has a third thickness ($T_5$) smaller than the first thickness ($T_3$).

In the bidirectional Zener diode according to one preferred embodiment of the present invention, the insulating layer may have a second contact hole that exposes the second impurity region, and the second electrode film may be connected to the second impurity region through the second contact hole, and the insulating layer may include a fourth portion that has a fourth thickness ($T_6$) and that forms the second contact hole and a fifth portion that surrounds the fourth portion and that has a fifth thickness ($T_7$) larger than the fourth thickness ($T_6$).

In the bidirectional Zener diode according to one preferred embodiment of the present invention, the insulating layer may include a sixth portion that is formed between the fourth portion and the fifth portion and that has a sixth thickness ($T_8$) smaller than the fourth thickness ($T_6$).

In the bidirectional Zener diode according to one preferred embodiment of the present invention, a plurality of the first impurity regions and a plurality of the second impurity regions may be alternately arrayed along a predetermined array direction.

The bidirectional Zener diode according to one preferred embodiment of the present invention may include a first external electrode that is connected to the first electrode film and that has a front surface including a plurality of first convex portions partitioned by a first groove and a second external electrode that is connected to the second electrode film and that has a front surface including a plurality of second convex portions partitioned by a second groove.

In the bidirectional Zener diode according to one preferred embodiment of the present invention, the plurality of first convex portions and the plurality of second convex portions may be each arrayed in a staggered manner.

A method for manufacturing a bidirectional Zener diode according to one preferred embodiment of the present invention includes a step of implanting a second conductivity type impurity into a first conductivity type base region formed at a front surface portion of a substrate and then forming a first impurity region and a second impurity region away from each other by applying heat treatment, a step of forming an insulating layer on a front surface of the substrate, a step of forming an electrode film on the insulating layer so as to be electrically connected to the first impurity region and to the second impurity region, and a step of applying dry etching to the electrode film and hence forming the electrode film into an electrode pattern that includes a first electrode film electrically connected to the first impurity region and a second electrode film electrically connected to the second impurity region, and, in the bidirectional Zener diode, the electrode pattern has a first region that is sandwiched between the first electrode film and the second electrode film and that includes a portion having an aspect ratio (A) of 1 or larger.

Preferred embodiments of the present invention will be hereinafter described in detail with reference to the accompanying drawings.

Figure 2:
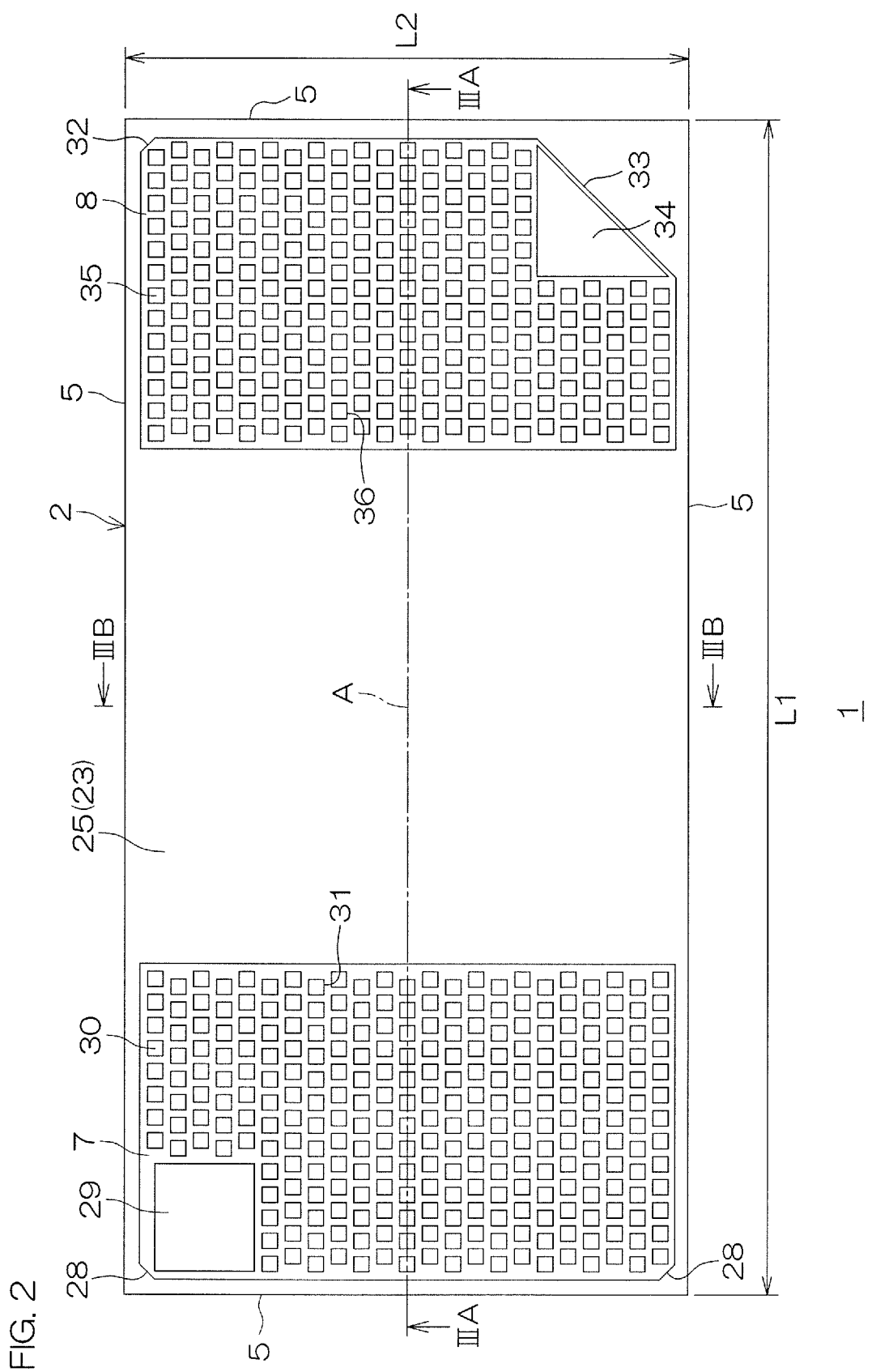
FIG. 2 is a plan view of the bidirectional Zener diode of FIG. 1.
Figure 3A:
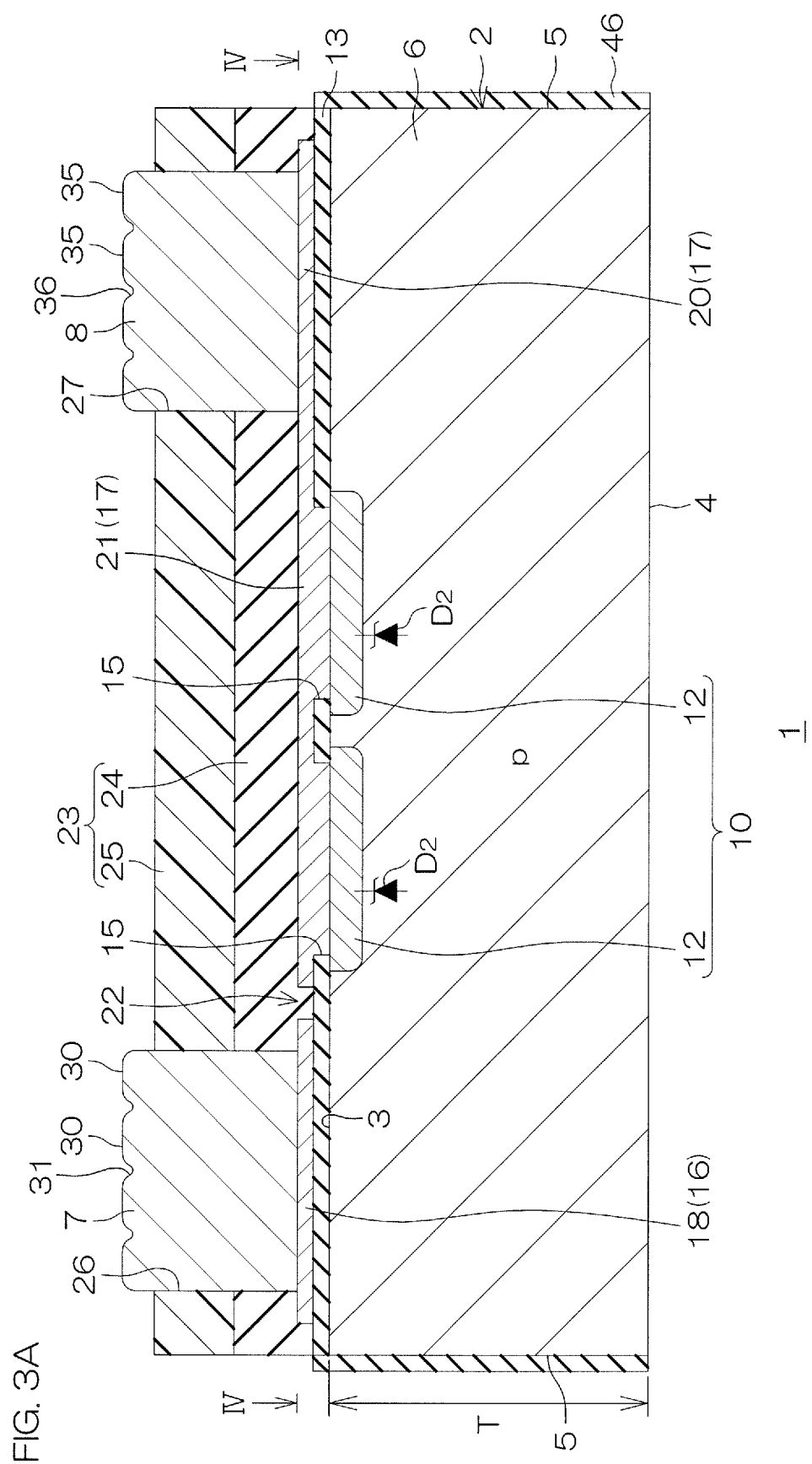
FIG. 3A is a longitudinal sectional view along line IIIA-IIIA of FIG. 2.
Figure 3B:
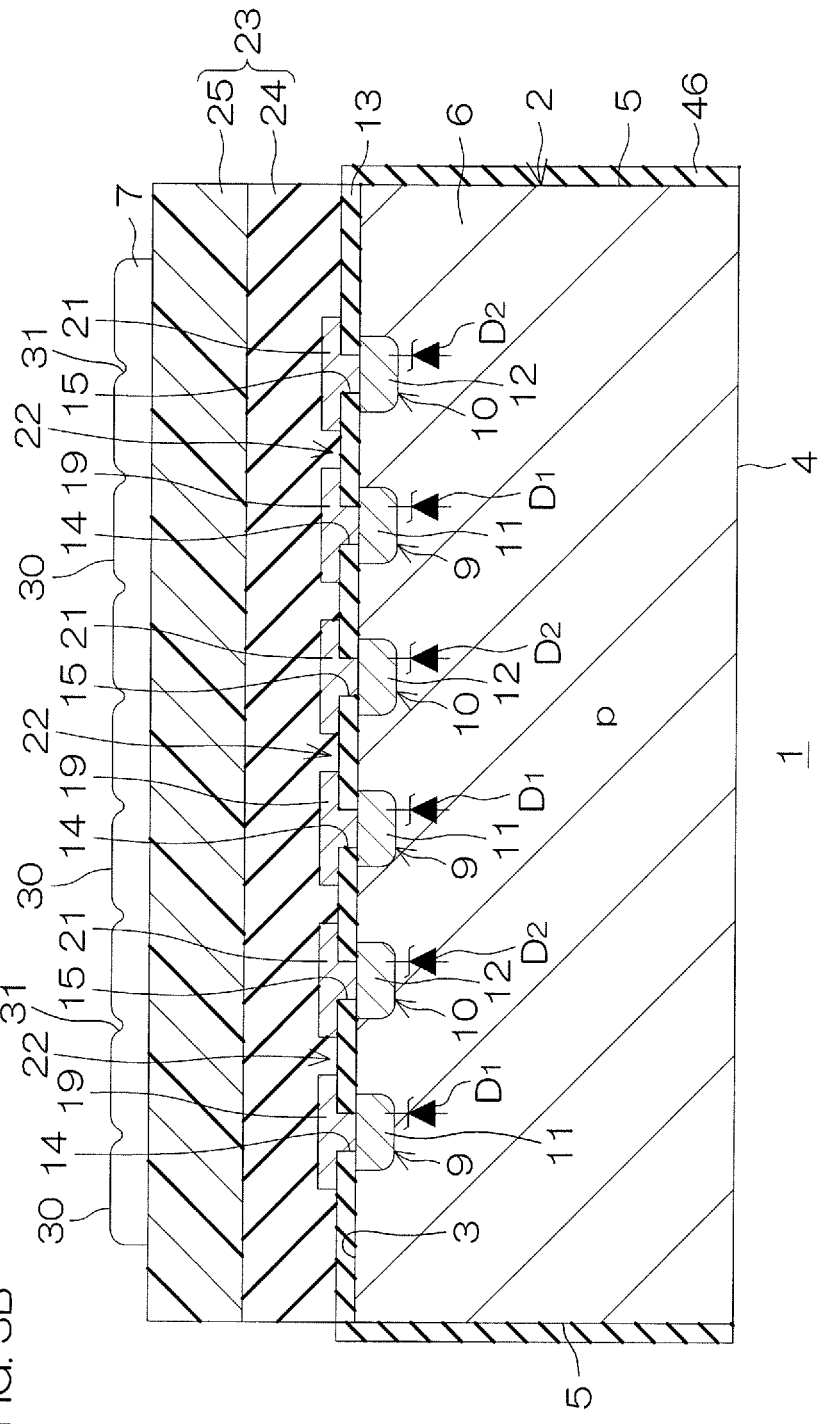
FIG. 3B is a longitudinal sectional view along line IIIB-IIIB of FIG. 2.
Figure 4:
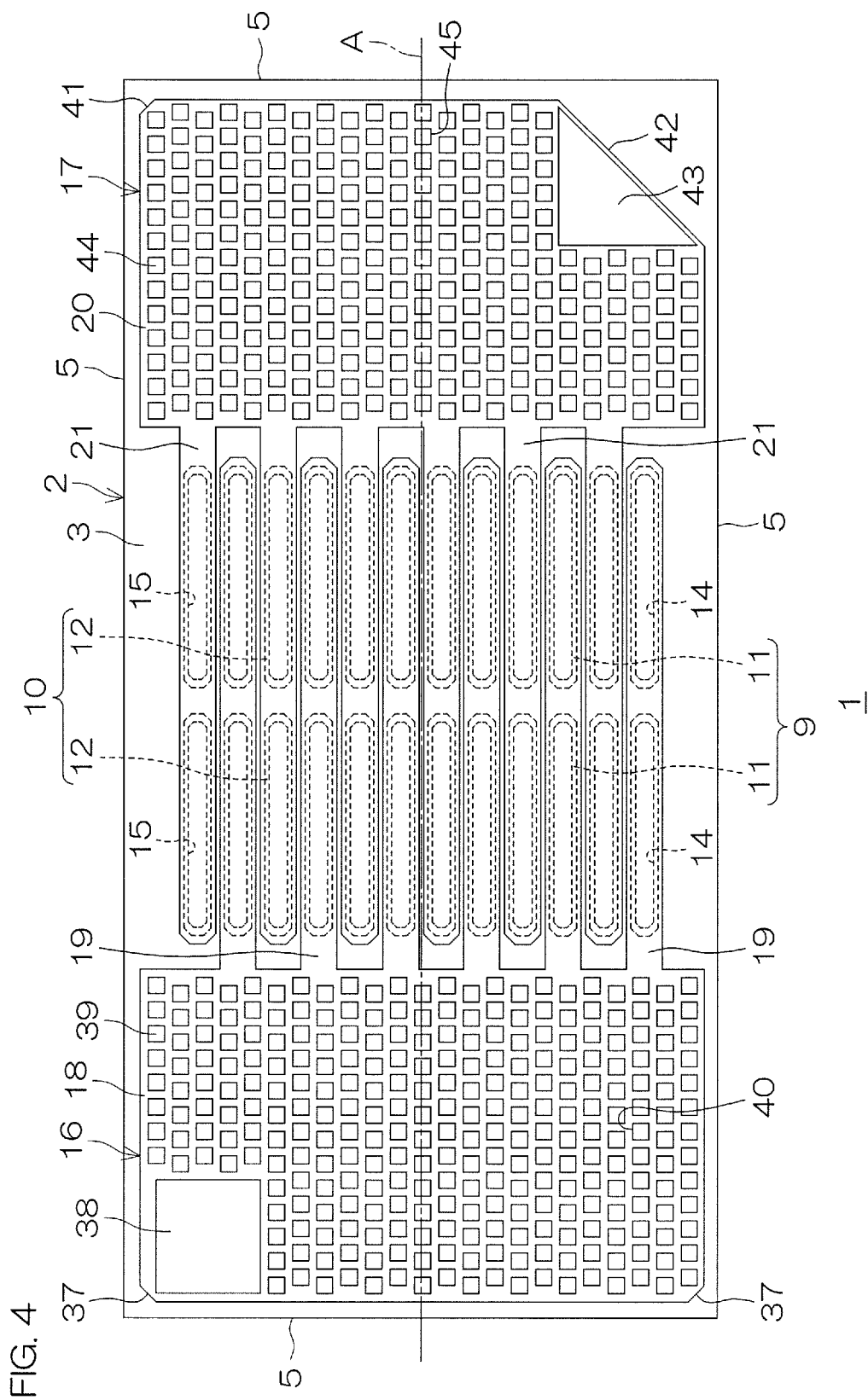
FIG. 4 is a transverse sectional view along line IV-IV of FIG. 3A.

FIG. 1 is a schematic perspective view of a bidirectional Zener diode 1 according to a preferred embodiment of the present invention. FIG. 2 is a plan view of the bidirectional Zener diode 1 of FIG. 1. FIG. 3A is a longitudinal sectional view along line IIIA-IIIA of FIG. 2. FIG. 3B is a longitudinal sectional view along line IIIB-IIIB of FIG. 2. FIG. 4 is a transverse sectional view along line IV-IV of FIG. 3A. In FIG. 1, a concavoconvex surface of a first external electrode 7 and a concavoconvex surface of a second external electrode 8 are omitted. Additionally, in FIG. 3B, first impurity region groups 9 and second impurity region groups 10 are depicted by reducing the number of those impurity region groups from the viewpoint of visual clarity.

The bidirectional Zener diode 1 includes a substrate 2 formed in a substantially rectangular parallelepiped shape. The substrate 2 may be a silicon substrate. The length L1 of a long side in a longitudinal direction of the substrate 2 is, for example, 0.4 mm to 2 mm. The length L2 of a short side in a lateral direction of the substrate 2 is, for example, 0.2 mm to 2 mm. The thickness T of the substrate 2 is, for example, 0.1 mm to 0.5 mm. The employment of the substrate 2 having this size makes it possible to form the bidirectional Zener diode 1 as a so-called chip component, hence making it possible to apply the bidirectional Zener diode 1 to various applications.

The substrate 2 has a first plane 3, a second plane 4 on the side opposite to the first plane 3, and a third plane 5 by which the first plane 3 and the second plane 4 are connected together. The first plane 3 and the second plane 4 of the substrate 2 are each formed in a rectangular shape in a plan view when seen from the normal direction of the first and second planes 3 and 4 (hereinafter, referred to simply as "in a plan view"). The first plane 3, the second plane 4, and the third plane 5 of the substrate 2 may be referred to as a front surface, a rear surface, and a side surface of the substrate 2, respectively. Additionally, in the present preferred embodiment, the third plane 5 is partitioned into four planes in total, i.e., is partitioned into a pair of planes that face each other in the longitudinal direction of the substrate 2 and a pair of planes that face each other in the lateral direction of the substrate 2 because of the fact that the substrate 2 is formed in a rectangular shape in a plan view. On the other hand, even if the substrate 2 is, for example, circular in a plan view, ellipsoidal in a plan view, or rectangular in a plan view, the third plane 5 may not be necessarily required to be clearly partitioned into a plurality of planes unlike that of FIG. 1 if each corner portion is chamfered.

Referring to FIG. 3A and FIG. 3B, a p type base region 6 is formed in the substrate 2 and is exposed from the first plane 3 of the substrate 2. In the present preferred embodiment, p type impurities are introduced into the entirety in a thickness direction of the substrate 2 from the first plane 3 to the second plane 4 of the substrate 2. Hence, the base region 6 is formed in the whole region of the substrate 2, and the substrate 2 is configured to be regarded as a p type substrate. The specific resistance of the substrate 2 may be set at about 5 mΩ·cm by introducing p type impurities.

A first external electrode 7 and a second external electrode 8 are formed on the first plane 3 of the substrate 2. The first external electrode 7 is formed at one end portion in the longitudinal direction of the substrate 2. The second external electrode 8 is formed at the other end portion in the longitudinal direction of the substrate 2.

Referring to FIG. 3A, FIG. 3B, and FIG. 4, a plurality of (in the present preferred embodiment, six) first impurity region groups 9 and a plurality of (in the present preferred embodiment, six) second impurity region groups 10, which are electrically connected to the first external electrode 7 and the second external electrode 8, are formed at a front surface portion of the base region 6 between the first external electrode 7 and the second external electrode 8.

The first impurity region group 9 extends in the longitudinal direction of the substrate 2, and includes a plurality of (in the present preferred embodiment, two) n type first impurity regions 11 that are arranged with an interval between the first impurity regions 11 in the longitudinal direction of the substrate 2. The second impurity region group 10 extends in parallel with the first impurity region group 9, and includes a plurality of (in the present preferred embodiment, two) n type second impurity regions 12 that are arranged with an interval between the second impurity regions 12 in the longitudinal direction of the substrate 2. The first impurity region group 9 and the second impurity region group 10 are alternately arranged in the lateral direction of the substrate 2, and have a stripe shape as a whole.

The first impurity region 11 and the second impurity region 12 are adjacent to each other in the lateral direction of the substrate 2. Therefore, likewise, the first impurity region 11 and the second impurity region 12 are alternately arranged in the lateral direction of the substrate 2. As thus described, the first impurity region 11 and the second impurity region 12 are arranged in a 12-row×2-column matrix manner at the first plane 3 of the substrate 2.

In FIG. 4, the first impurity region groups 9 are formed at even-numbered rows, respectively, and the second impurity region groups 10 are formed at odd-numbered rows, respectively if the rows are defined as a first row, a second row, a third row, a fourth row, a fifth row, a sixth row, a seventh row, an eighth row, a ninth row, a tenth row, an eleventh row, and a twelfth row in order from the upper side and if the columns are defined as a first column and a second column in order from the left side. In each of the first impurity region groups 9, the first impurity region 11 is formed at the first column and at the second column one by one. Likewise, in each of the second impurity region groups 10, the second impurity region 12 is formed at the first column and at the second column one by one.

The first impurity region 11 and the second impurity region 12 may be formed with the same depth and the same n type impurity concentration. Each n type impurity concentration of the first and second impurity regions 11 and 12 may be, for example, $1.0 \times 10^{19}$ cm$^{-3}$ to $1.0 \times 10^{21}$ cm$^{-3}$. The first impurity region 11 and the second impurity region 12 are each formed to have the same shape and the same area in a plan view shown in FIG. 4. The first impurity region 11 and the second impurity region 12 extend in the longitudinal direction of the substrate 2 in a plan view, and are each formed in a rectangular shape whose four corners are cut off (i.e., a rectangular shape whose angles are rounded off).

The first impurity region 11 makes a pn junction with the base region 6. A first Zener diode $D_1$ is formed by a pn junction portion between the first impurity region 11 and the base region 6. On the other hand, the second impurity region 12 makes a pn junction with the base region 6. A second Zener diode $D_2$ is formed by a pn junction portion between the second impurity region 12 and the base region 6. The first Zener diode $D_1$ and the second Zener diode $D_2$ are connected in anti-series through the base region 6. The first impurity region 11 and the second impurity region 12 are formed with an interval between the first impurity region 11 and the second impurity region 12 so that a depletion layer spreading from the pn junction portion between the first impurity region 11 and the base region 6 and a depletion layer spreading from the pn junction portion between the second impurity region 12 and the base region 6 do not overlap with each other.

A surface insulating film 13 is formed at the first plane 3 of the substrate 2. The surface insulating film 13 covers substantially the whole area of the first plane 3 of the substrate 2. Therefore, the surface insulating film 13 is formed in a quadrangular shape that matches the first plane 3 of the substrate 2 in a plan view. The surface insulating film 13 may include one of or both of an oxide film (SiO$_2$ film) and a nitride film (SiN film). Additionally, the surface insulating film 13 may have a thickness of, for example, 0.1 μm to 2 μm.

A first contact hole 14 by which the first impurity region 11 is exposed and a second contact hole 15 by which the second impurity region 12 is exposed are formed in the surface insulating film 13.

A first electrode film 16 and a second electrode film 17 are formed on the surface insulating film 13 with an interval between the first electrode film 16 and the second electrode film 17.

The first electrode film 16 integrally includes a first pad portion 18 and a plurality of first wiring portions 19. The first pad portion 18 is formed in a substantially rectangular shape in a plan view, and is formed at one end portion in the longitudinal direction of the substrate 2. The plurality of first wiring portions 19 are linearly drawn out from the first pad portion 18 toward the second pad portion 20 in the longitudinal direction of the substrate 2 and cover the plurality of first impurity region groups 9, respectively, with a one-on-one correspondence relationship. Each of the first wiring portions 19 is larger in width than the first impurity region 11. The first wiring portion 19 enters the first contact hole 14 from above the surface insulating film 13, and makes an ohmic contact with the first impurity region 11.

The second electrode film 17 integrally includes a second pad portion 20 and a plurality of second wiring portions 21. The second pad portion 20 is formed in a substantially rectangular shape in a plan view, and is formed at the other end portion in the longitudinal direction of the substrate 2. The plurality of second wiring portions 21 are linearly drawn out from the second pad portion 20 toward the first pad portion 18 in the longitudinal direction of the substrate 2 and cover the plurality of second impurity region groups 10, respectively, with a one-on-one correspondence relationship. Each of the second wiring portions 21 is larger in width than the second impurity region 12. The second wiring portion 21 enters the second contact hole 15 from above the surface insulating film 13, and makes an ohmic contact with the second impurity region 12.

The first wiring portion 19 and the second wiring portion 21 are each formed in a comb-teeth shape so that the first and second wiring portions 19 and 21 engage each other. The first wiring portion 19 and the second wiring portion 21 are electrically insulated by a slit 22 with which their peripheral edge portions are rimmed. In each of the first and second electrode films 16 and 17, a material including Al may be used as its electrode material. For example, AlCu, AlSiCu, etc., can be mentioned as such a material, and it is preferable to use AlCu from the viewpoint of heightening a peak pulse current $I_{pp}$.

An insulating layer 23 is formed on the surface insulating film 13. The insulating layer 23 covers the first electrode film 16 and the second electrode film 17. The insulating layer 23 includes a first insulating film 24 and a second insulating film 25 that are stacked in this order from the surface-insulating-film-13 side. The first insulating film 24 may include one of or both of, for example, an oxide film ($SiO_2$ film) and a nitride film (SiN film). The second insulating film 25 may include an insulating resin such as polyimide. Additionally, the insulating layer 23 may have a thickness of, for example, 1 μm to 10 μm. In the present preferred embodiment, the thickness of the first insulating film 24 may be, for example, 0.5 μm to 2 μm, and the thickness of the second insulating film 25 may be, for example, 0.5 μm to 8 μm.

A first opening 26 and a second opening 27 are formed in the insulating layer 23. The first opening 26 exposes the first pad portion 18 of the first electrode film 16. The second opening 27 exposes the second pad portion 20 of the second electrode film 17.

The first external electrode 7 is formed in the first opening 26. The first external electrode 7 is electrically connected to the first electrode film 16 in the first opening 26. Hence, the first external electrode 7 is electrically connected to each of the first impurity regions 11 through the first electrode film 16. Additionally, the first external electrode 7 functions as a terminal when the bidirectional Zener diode 1 is mounted according to flip-chip packaging, and therefore the first external electrode 7 may be referred to as a first external terminal.

The first external electrode 7 protrudes from the insulating layer 23. Additionally, the first external electrode 7 may have a layered structure in which a plurality of metal films are stacked together. The plurality of metal films may include an Ni film, a Pd film, and an Au film stacked in this order from the first-electrode-film-16 side.

The second external electrode 8 is formed in the second opening 27. The second external electrode 8 is electrically connected to the second electrode film 17 in the second opening 27. Hence, the second external electrode 8 is electrically connected to each of the second impurity regions 12 through the second electrode film 17. Additionally, the second external electrode 8 functions as a terminal when the bidirectional Zener diode 1 is mounted according to flip-chip packaging, and therefore the second external electrode 8 may be referred to as a second external terminal.

The second external electrode 8 is formed protrudes from the insulating layer 23. The second external electrode 8 may have a layered structure in which a plurality of metal films are stacked together. The plurality of metal films may include an Ni film, a Pd film, and an Au film stacked in this order from the second-electrode-film-17 side.

Referring to FIG. 2, FIG. 3A, and FIG. 3B, the first external electrode 7 is formed in a substantially rectangular shape that is long in the lateral direction of the substrate 2 in a plan view. Corner portions of the first external electrode 7 respectively formed at the corner portions of the substrate 2 are chamfered, and, as a result, the first external electrode 7 has corner planes 28 facing the corner portions of the substrate 2 at the pair of corner portions, respectively. Additionally, the first external electrode 7 is formed in a line-symmetric shape with respect to a symmetry axis A along the longitudinal direction of the substrate 2.

A first flat portion 29 and a plurality of first convex portions 30 are formed on a front surface of the first external electrode 7. The first flat portion 29 is a portion of the first external electrode 7 whose front surface is flattened, and is formed near one of the pair of corner planes 28 (corner portions) of the first external electrode 7. In the present preferred embodiment, the first flat portion 29 is formed in a quadrangular shape in a plan view.

The plurality of first convex portions 30 are formed around the first flat portion 29 of the first external electrode 7, and define undulation in regions other than the first flat portion 29 of the front surface of the first external electrode 7. In the present preferred embodiment, each of the first convex portions 30 is formed in a quadrangular shape in a plan view. The plurality of first convex portions 30 have a surface area smaller than the first flat portion 29. In the present preferred embodiment, the first convex portions 30 are in a partitioned state in a staggered array by means of a first groove 31 formed at the front surface of the first external electrode 7.

Referring to FIG. 2, FIG. 3A, and FIG. 3B, the second external electrode 8 is formed in a substantially rectangular shape that is long in the lateral direction of the substrate 2 in a plan view. Corner portions of the second external electrode 8 respectively formed at the corner portions of the substrate 2 are chamfered, and, as a result, the second external electrode 8 has a first corner plane 32 and a second corner plane 33 facing the corner portions of the substrate 2 at the pair of corner portions, respectively. In the present preferred embodiment, the width (amount of chamfering) of the second corner plane 33 is larger than the width (amount of chamfering) of the first corner plane 32 (for example, five to ten times). Hence, the second external electrode 8 is formed in a non-line-symmetric shape with respect to the symmetric axis A along the longitudinal direction of the substrate 2. Additionally, when the width of the second corner plane 33 is comparatively large, the shape of the second external electrode 8 may be expressed as a substantially pentagonal shape that is long in the lateral direction of the substrate 2 if the width of the second corner plane 33 and the length of a side along the longitudinal direction of the substrate 2 continuous with the second corner plane 33 are substantially equal to each other as in, for example, FIG. 2.

A second flat portion 34 and a plurality of second convex portions 35 are formed on a front surface of the second external electrode 8. The second flat portion 34 is a portion of the second external electrode 8 whose front surface is flattened, and is formed near the second corner plane 33 that is one of the pair of corner planes 32 and 33 (corner portions) of the second external electrode 8. Hence, the first flat portion 29 of the first external electrode 7 and the second flat portion 34 of the second external electrode 8 are formed at the corner portions of the substrate 2 having a diagonal relationship, respectively. Additionally, in the present preferred embodiment, the second flat portion 34 is formed in an isosceles triangle shape (more specifically, an isosceles right triangle shape) in which a side along the second corner plane 33 is a base side in a plan view.

The plurality of second convex portions 35 are formed around the second flat portion 34 of the second external electrode 8, and define undulation in regions other than the second flat portion 34 of the front surface of the second external electrode 8. In the present preferred embodiment, each of the second convex portions 35 is formed in a quadrangular shape in a plan view. The plurality of second convex portions 35 have a surface area smaller than the second flat portion 34. In the present preferred embodiment, the second convex portions 35 are in a partitioned state in a staggered array by means of a second groove 36 formed at the front surface of the second external electrode 8.

According to the thus formed first and second external electrodes 7 and 8, when light is projected onto the front surface of each of the first and second external electrodes 7 and 8, it is possible to diffusely reflect the light in an excellent manner by means of the concave-convex surface formed by both the first convex portion 30 and the first groove 31 and by means of the concave-convex surface formed by both the second convex portion 35 and the second groove 36. This makes it possible to excellently ascertain the first external electrode 7 and the second external electrode 8, thus making it possible to easily make a front-or-back determination about the bidirectional Zener diode 1.

Additionally, it is possible to press a tip end portion of a probe against the first and second flat portions 29 and 34 of the first and second external electrodes 7 and 8, respectively, when an electric test is performed, hence making it possible to excellently measure electrical properties of the bidirectional Zener diode 1. Moreover, the first flat portion 29 and the second flat portion 34 are positionally in a mutually diagonal relationship, and are comparatively distant from each other in a surface region of the substrate 2, and therefore it is possible to efficiently perform an electric test by use of the probe.

Additionally, the first external electrode 7 has a line-symmetric shape, and the second external electrode 8 has a non-line-symmetric shape, and therefore it is possible to easily determine whether it is the first external electrode 7 or the second external electrode 8.

Additionally, it is possible to increase the surface area of the front surface of each of the first and second external electrodes 7 and 8 by means of concavo-convex portions provided at the front surface of each of the first and second external electrodes 7 and 8. This makes it possible to increase the contact area between the front surface of each of the first and second external electrodes 7 and 8 and a joining material, such as solder, when the bidirectional Zener diode 1 is mounted on a mounting board by use of the joining material. Therefore, it is possible to excellently mount the bidirectional Zener diode 1 on the mounting board.

Additionally, the concavo-convex portions provided at the front surface of each of the first and second external electrodes 7 and 8 also make it possible to prevent insulating foreign substances existing at the tip end portion of the probe from adhering to the front surface of each of the first and second external electrodes 7 and 8 when an electric test is performed.

Referring to FIG. 4, the first pad portion 18 of the first electrode film 16 and the second pad portion 20 of the second electrode film 17 have planar shapes that coincide with planar shapes of the first and second external electrodes 7 and 8, respectively.

In other words, the first pad portion 18 is formed in a substantially rectangular shape that is long in the lateral direction of the substrate 2 in a plan view. Corner portions of the first pad portion 18 respectively formed at the corner portions of the substrate 2 are chamfered, and, as a result, the first pad portion 18 has corner planes 37 facing the corner portions of the substrate 2 at the pair of corner portions, respectively. Additionally, the first pad portion 18 is formed in a line-symmetric shape with respect to the symmetric axis A along the longitudinal direction of the substrate 2.

A first flat portion 38 and a plurality of first convex portions 39 are formed on a front surface of the first pad portion 18. The first flat portion 38 is a portion of the first pad portion 18 whose front surface is flattened, and is formed near one of the pair of corner planes 37 (corner portions) of the first pad portion 18. In the present preferred embodiment, the first flat portion 38 is formed in a quadrangular shape in a plan view.

The plurality of first convex portions 39 are formed around the first flat portion 38 of the first pad portion 18, and define undulation in regions other than the first flat portion 38 of the front surface of the first pad portion 18. In the present preferred embodiment, each of the first convex portions 39 is formed in a quadrangular shape in a plan view. The plurality of first convex portions 39 have a surface area smaller than the first flat portion 38. In the present preferred embodiment, the plurality of first convex portions 39 are in a partitioned state in a staggered array by means of a first groove 40 formed at the front surface of the first pad portion 18.

The second pad portion 20 is formed in a substantially rectangular shape that is long in the lateral direction of the substrate 2 in a plan view. Corner portions of the second pad portion 20 respectively formed at the corner portions of the substrate 2 are chamfered, and, as a result, the second pad portion 20 has a first corner plane 41 and a second corner plane 42 facing the corner portions of the substrate 2 at the pair of corner portions, respectively. In the present preferred embodiment, the width (amount of chamfering) of the second corner plane 42 is larger than the width (amount of chamfering) of the first corner plane 41 (for example, five to ten times). Hence, the second pad portion 20 is formed in a non-line-symmetric shape with respect to the symmetric axis A along the longitudinal direction of the substrate 2. Additionally, when the width of the second corner plane 42 is comparatively large, the shape of the second pad portion 20 may be expressed as a substantially pentagonal shape that is long in the lateral direction of the substrate 2 if the width of the second corner plane 42 and the length of a side along the longitudinal direction of the substrate 2 continuous with the second corner plane 42 are substantially equal to each other as in, for example, FIG. 4.

A second flat portion 43 and a plurality of second convex portions 44 are formed on a front surface of the second pad portion 20. The second flat portion 43 is a portion of the second pad portion 20 whose front surface is flattened, and is formed near the second corner plane 42 that is one of the pair of corner planes 41 and 42 (corner portions) of the second pad portion 20. Hence, the first flat portion 38 of the first pad portion 18 and the second flat portion 43 of the second pad portion 20 are formed at the corner portions of the substrate 2 having a diagonal relationship, respectively. Additionally, in the present preferred embodiment, the second flat portion 43 is formed in an isosceles triangle shape (more specifically, an isosceles right triangle shape) in which a side along the second corner plane 42 is a base side in a plan view.

The plurality of second convex portions 44 are formed around the second flat portion 43 of the second pad portion 20, and define undulation in regions other than the second flat portion 43 of the front surface of the second pad portion 20. In the present preferred embodiment, each of the second convex portions 44 is formed in a quadrangular shape in a plan view. The plurality of second convex portions 44 have a surface area smaller than the second flat portion 43. In the present preferred embodiment, the plurality of second convex portions 44 are in a partitioned state in a staggered array by means of a second groove 45 formed at the front surface of the second pad portion 20.

Referring to FIG. 1, FIG. 3A, and FIG. 3B, an insulating film 46 is formed on the third plane 5 of the substrate 2. The insulating film 46 may include one of or both of, for example, an oxide film (SiO$_2$ film) and a nitride film (SiN film). The insulating film 46 integrally covers the whole area of the third plane 5 of the substrate 2. On the other hand, the second plane 4 of the substrate 2 may be covered with the insulating film 46 (not shown) although the second plane is exposed from the insulating film 46 in the present preferred embodiment. Additionally, the insulating film 46 may have a thickness of, for example, 0.1 µm to 2 µm.

Figure 5:
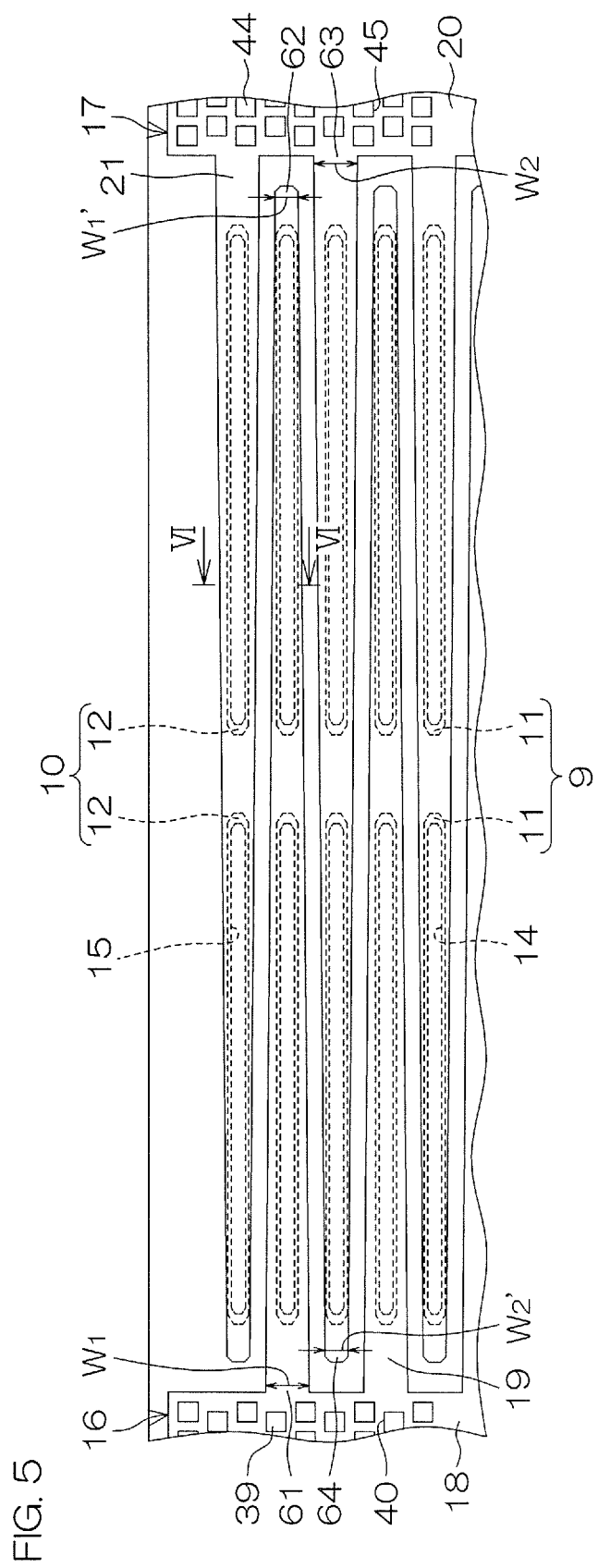
FIG. 5 is an enlarged view of a main portion of FIG. 4.
Figure 6:
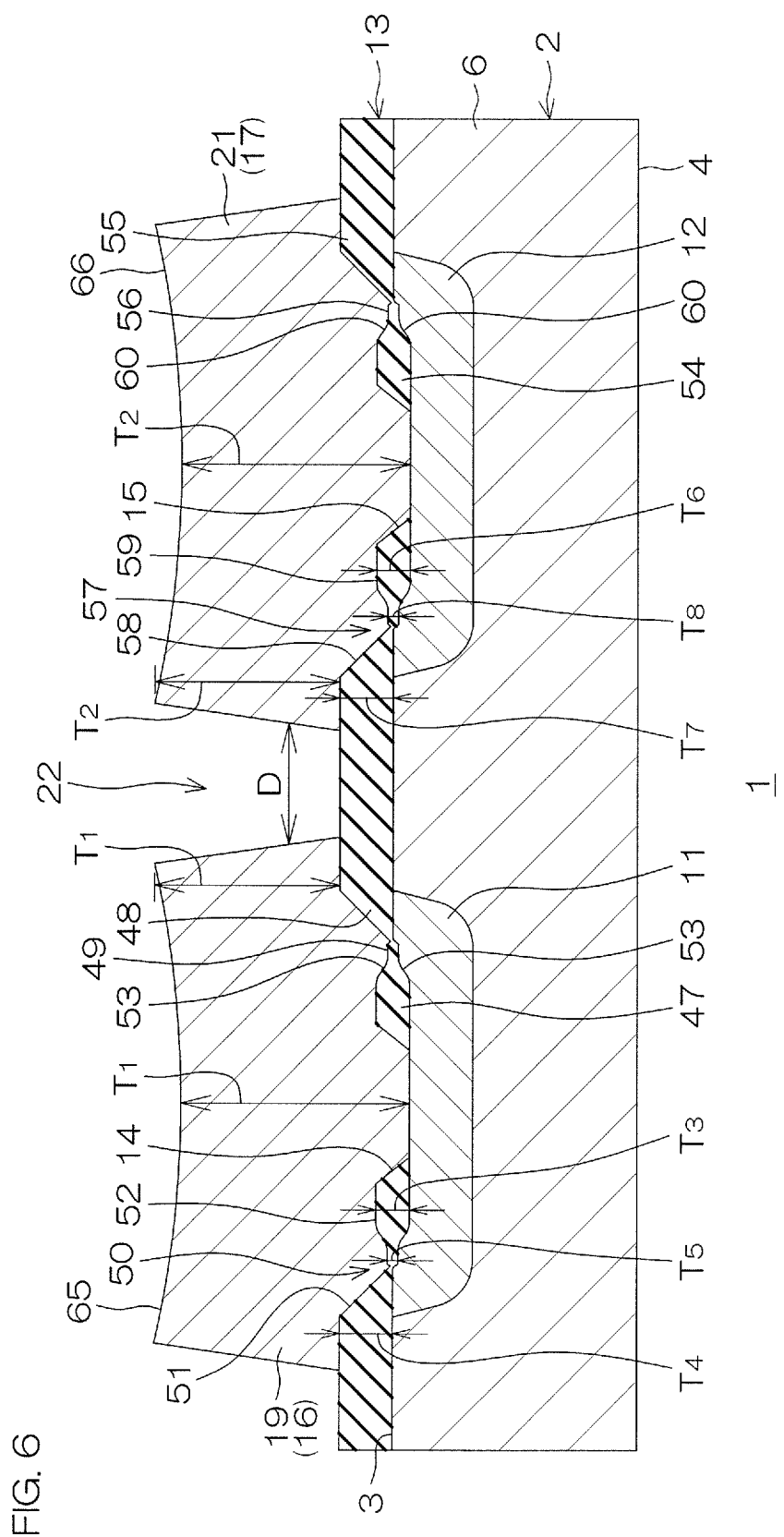
FIG. 6 is a longitudinal sectional view along line VI-VI of FIG. 5.

FIG. 5 is an enlarged view of a main portion of FIG. 4. FIG. 6 is a longitudinal sectional view along line VI-VI of FIG. 5. In FIG. 5 and FIG. 6, the first external electrode 7, the second external electrode 8, and the insulating layer 23 are omitted.

Next, the shape of the first electrode film 16, the shape of the second electrode film 17, the shape of the surface insulating film 13, etc., will be described in more detail with reference to FIG. 5 and FIG. 6.

First, referring to FIG. 6, the surface insulating film 13 includes a first portion 47, a second portion 48, and a third portion 49, which differ from each other in thickness, around the first contact hole 14.

The first portion 47 is partially buried in the substrate 2 with respect to the first plane 3 of the substrate 2. In the present preferred embodiment, substantially half the first portion 47 in the thickness direction of the first portion 47 is buried in the substrate 2, and the remaining half is formed on the first plane 3 of the substrate 2. Additionally, the first portion 47 defines the first contact hole 14. The first contact hole 14 is formed in a tapered shape so as to become gradually thinner toward the substrate 2 from the front surface of the surface insulating film 13 in the first portion 47. Additionally, the first portion 47 has a first thickness T$_3$ that may be, for example, 0.2 µm to 1 µm.

The entirety of the second portion 48 is formed on the first plane 3 of the substrate 2. The second portion 48 is a portion that covers most of the surface insulating film 13, except for the first portion 47 and the third portion 49 that are formed near the first contact hole 14. The second portion 48 surrounds the first portion 47 around the first contact hole 14. Additionally, the second portion 48 has a second thickness T$_4$ larger than the first thickness T$_3$, and the second thickness T$_4$ may be, for example, 0.5 µm to 2 µm.

The third portion 49 is partially buried in the substrate 2 with respect to the first plane 3 of the substrate 2 in the same way as the first portion 47. In the present preferred embodiment, substantially half the third portion 49 in the thickness direction of the third portion 49 is buried in the substrate 2, and the remaining half is formed on the first plane 3 of the substrate 2. The third portion 49 is formed between the first portion 47 and the second portion 48. In other words, the third portion 49 surrounds the first portion 47, and the second portion 48 surrounds the third portion 49. The first portion 47 and the second portion 48 are connected together by means of the third portion 49. The third portion 49 has a third thickness T$_5$ smaller than the first thickness T$_3$, and the third thickness T$_5$ may be, for example, 0.1 µm to 0.5 µm.

As thus described, there is a film thickness difference between the first portion 47 and the second portion 48, and, because of this film thickness difference, a concave portion 50 is formed around the first contact hole 14 at the surface insulating film 13. A bottom surface 52 of the concave portion 50 is formed of the first portion 47, and a side surface 51 of the concave portion 50 is formed of the second portion 48. The third portion 49 may form a part of the bottom surface 52 of the concave portion 50.

The side surface 51 of the concave portion 50 is formed in a tapered shape so as to become gradually thinner toward the substrate 2 from the front surface of the surface insulating film 13 in the present preferred embodiment.

Additionally, a level difference that results from a film thickness difference between the first portion 47 and the third portion 49 may be formed at a boundary portion between the first portion 47 and the third portion 49 at the bottom surface 52 of the concave portion 50. Additionally, in the bottom surface 52 of the concave portion 50, the boundary portion between the first portion 47 and the third portion 49 may be an oblique surface 53 that spreads from the first portion 47 toward the third portion 49. This oblique surface 53 is formed on the rear surface side of the surface insulating film (i.e., on the side contiguous to the substrate 2), and therefore the boundary portion between the first portion 47 and the third portion 49 may be a portion in which its thickness becomes continuously smaller in proportion to receding from the first contact hole 14.

The surface insulating film 13 includes a fourth portion 54, a fifth portion 55, and a sixth portion 56, which differ from each other in thickness, around the second contact hole 15.

The fourth portion 54 is partially buried in the substrate 2 with respect to the first plane 3 of the substrate 2. In the present preferred embodiment, substantially half the fourth portion 54 in the thickness direction of the fourth portion 54 is buried in the substrate 2, and the remaining half is formed on the first plane 3 of the substrate 2. Additionally, the fourth portion 54 defines the second contact hole 15. The second contact hole 15 is formed in a tapered shape so as to become gradually thinner toward the substrate 2 from the front surface of the surface insulating film 13 in the fourth portion 54. Additionally, the fourth portion 54 has a fourth thickness T$_6$ that may be, for example, 0.2 µm to 1 µm.

The entirety of the fifth portion 55 is formed on the first plane 3 of the substrate 2. The fifth portion 55 is a portion that covers most of the surface insulating film 13, except for the fourth portion 54 and the sixth portion 56 that are formed near the second contact hole 15, and the fifth portion 55 may include a portion shared with the aforementioned second portion 48. The fifth portion 55 surrounds the fourth portion 54 around the second contact hole 15. Additionally, the fifth portion 55 has a fifth thickness $T_7$ larger than the fourth thickness $T_6$, and the fifth thickness $T_7$ may be, for example, 0.5 μm to 2 μm.

The sixth portion 56 is partially buried in the substrate 2 with respect to the first plane 3 of the substrate 2 in the same way as the fourth portion 54. In the present preferred embodiment, substantially half the sixth portion 56 in the thickness direction of the sixth portion 56 is buried in the substrate 2, and the remaining half is formed on the first plane 3 of the substrate 2. The sixth portion 56 is formed between the fourth portion 54 and the fifth portion 55. In other words, the sixth portion 56 surrounds the fourth portion 54, and the fifth portion 55 surrounds the sixth portion 56. The fourth portion 54 and the fifth portion 55 are connected together by means of the sixth portion 56. Additionally, the sixth portion 56 has a sixth thickness $T_8$ smaller than the fourth thickness $T_6$, and the sixth thickness $T_8$ may be, for example, 0.1 μm to 0.5 μm.

As thus described, there is a film thickness difference between the fourth portion 54 and the fifth portion 55, and, because of this film thickness difference, a concave portion 57 is formed around the second contact hole 15 at the surface insulating film 13. A bottom surface 59 of the concave portion 57 is formed of the fourth portion 54, and a side surface 58 of the concave portion 57 is formed of the fifth portion 55. The sixth portion 56 may form a part of the bottom surface 59 of the concave portion 57.

The side surface 58 of the concave portion 57 is formed in a tapered shape so as to become gradually thinner toward the substrate 2 from the front surface of the surface insulating film 13 in the present preferred embodiment.

Additionally, a level difference that results from a film thickness difference between the fourth portion 54 and the sixth portion 56 may be formed at a boundary portion between the fourth portion 54 and the sixth portion 56 at the bottom surface 59 of the concave portion 57. Additionally, in the bottom surface 59 of the concave portion 57, the boundary portion between the fourth portion 54 and the sixth portion 56 may be an oblique surface 60 that spreads from the fourth portion 54 toward the sixth portion 56. This oblique surface 60 is formed on the rear surface side of the surface insulating film 13 as well (i.e., on the side contiguous to the substrate 2), and therefore the boundary portion between the fourth portion 54 and the sixth portion 56 may be a portion in which its thickness becomes continuously smaller in proportion to receding from the second contact hole 15.

Referring to FIG. 6, the first impurity region 11 has an extent that straddles over the first portion 47, the third portion 49, and the second portion 48 of the surface insulating film 13, and the first impurity region 11 covers the first portion 47, the third portion 49, and the second portion 48 from below. On the other hand, referring to FIG. 6, the second impurity region 12 has an extent that straddles over the fourth portion 54, the sixth portion 56, and the fifth portion 55 of the surface insulating film 13, and the second impurity region 12 covers the fourth portion 54, the sixth portion 56, and the fifth portion 55 from below.

Next, referring to FIG. 5, the first wiring portion 19 of the first electrode film 16 is formed in a tapered shape so as to become gradually thinner toward the second pad portion 20 from a connection portion 61 connected to the first pad portion 18. Hence, the first wiring portion 19 has the largest width $W_1$ in the connection portion 61 connected to the first pad portion 18, and has the minimum width in a tip end portion 62. In other words, the width of the first wiring portion 19 becomes continuously smaller in proportion to a progression from the connection portion 61 toward the tip end portion 62. For example, the maximum width $W_1$ may be twice or more the minimum width $W_1'$. More specifically, the width $W_1$ may be, for example, 6 μm to 12 μm, and the width $W_1'$ may be, for example, 5 μm to 10 μm. It is recommended to set the width of a portion between the connection portion 61 and the tip end portion 62 so as to fall within a range between the maximum width $W_1$ and the minimum width $W_1'$.

Referring to FIG. 5, the second wiring portion 21 of the second electrode film 17 is formed in a tapered shape so as to become gradually thinner toward the second pad portion 20 from a connection portion 63 connected to the second pad portion 20. Hence, the second wiring portion 21 has the largest width $W_2$ in the connection portion 63 connected to the second pad portion 20, and has the minimum width $W_2'$ in a tip end portion 64. In other words, the width of the second wiring portion 21 becomes continuously smaller in proportion to a progression from the connection portion 63 toward the tip end portion 64. For example, the maximum width $W_2$ may be twice or more the minimum width $W_2'$. More specifically, the width $W_2$ may be, for example, 6 μm to 12 μm, and the width $W_2'$ may be, for example, 5 μm to 10 μm. It is recommended to set the width of a portion between the connection portion 63 and the tip end portion 64 so as to fall within a range between the maximum width $W_2$ and the minimum width $W_2'$.

Next, referring to FIG. 6, the first wiring portion 19 of the first electrode film 16 has an extent (width) in which the first wiring portion 19 straddles over the first portion 47, the third portion 49, and the second portion 48 of the surface insulating film 13, and the first wiring portion 19 covers the first portion 47, the third portion 49, and the second portion 48 from above. In the present preferred embodiment, the first wiring portion 19 has a width larger than the first impurity region 11. On the other hand, the second wiring portion 21 of the second electrode film 17 has an extent (width) in which the second wiring portion 21 straddles over the fourth portion 54, the sixth portion 56, and the fifth portion 55 of the surface insulating film 13, and the second wiring portion 21 covers the fourth portion 54, the sixth portion 56 and the fifth portion 55 from above. In the present preferred embodiment, the second wiring portion 21 has a width larger than the second impurity region 12.

The first electrode film 16 and the second electrode film 17 have a thickness $T_1$ and a thickness $T_2$, respectively. These thicknesses $T_1$ and $T_2$ may be equal to each other, and are, for example, 3 μm to 5 μm. The thicknesses $T_1$ and $T_2$ may be lengths from the first plane 3 of the substrate 2 to an upper surface of the first electrode film 16 and to an upper surface of the second electrode film 17 in the position of the first contact hole 14 and in the position of the second contact hole 15, respectively. Additionally, the thicknesses $T_1$ and $T_2$ may be lengths from the front surface of the surface insulating film 13 to the upper surface of the first electrode film 16 and to the upper surface of the second electrode film 17, respectively, in an upper surface region of the surface insulating film 13.

A part of the first wiring portion 19 on the surface insulating film 13 and a part of the second wiring portion 21 on the surface insulating film 13 are leveled up resulting from the thickness of the surface insulating film 13. Hence, the first wiring portion 19 has a curved upper surface 65 that is concaved from the part of the first wiring portion 19 on the surface insulating film 13 toward the first contact hole 14. Additionally, the second wiring portion 21 has a curved upper surface 66 that is concaved from the part of the second wiring portion 21 on the surface insulating film 13 toward the second contact hole 15. Each side surface of the first and second wiring portions 19 and 21 may be an oblique surface that spreads from the upper surfaces 65 and 66 toward the surface insulating film 13.

As described above, the first wiring portion 19 and the second wiring portion 21 are electrically insulated from each other by means of the slit 22. The width of the slit 22 (i.e., distance D between the first wiring portion 19 and the second wiring portion 21) is, for example, 0.5 μm to 5 μm. If each side surface of the first and second wiring portions 19 and 21 is an oblique surface, the slit 22 is formed in a tapered shape so as to become gradually thinner toward the surface insulating film 13. At this time, the distance D may be measured at arbitrary positions in the thickness direction of the first and second wiring portions 19 and 21.

The thickness $T_1$ of the first wiring portion 19 and the thickness $T_2$ of the second wiring portion 21 are each 3 μm to 5 μm, and the width D of the slit 22 is 0.5 μm to 5 μm, and therefore the slit 22 has an aspect ratio A ($T_2$ or $T_2/D$) of 1 or larger, and may have, preferably, an aspect ratio A of 2 to 4.

Figure 7:
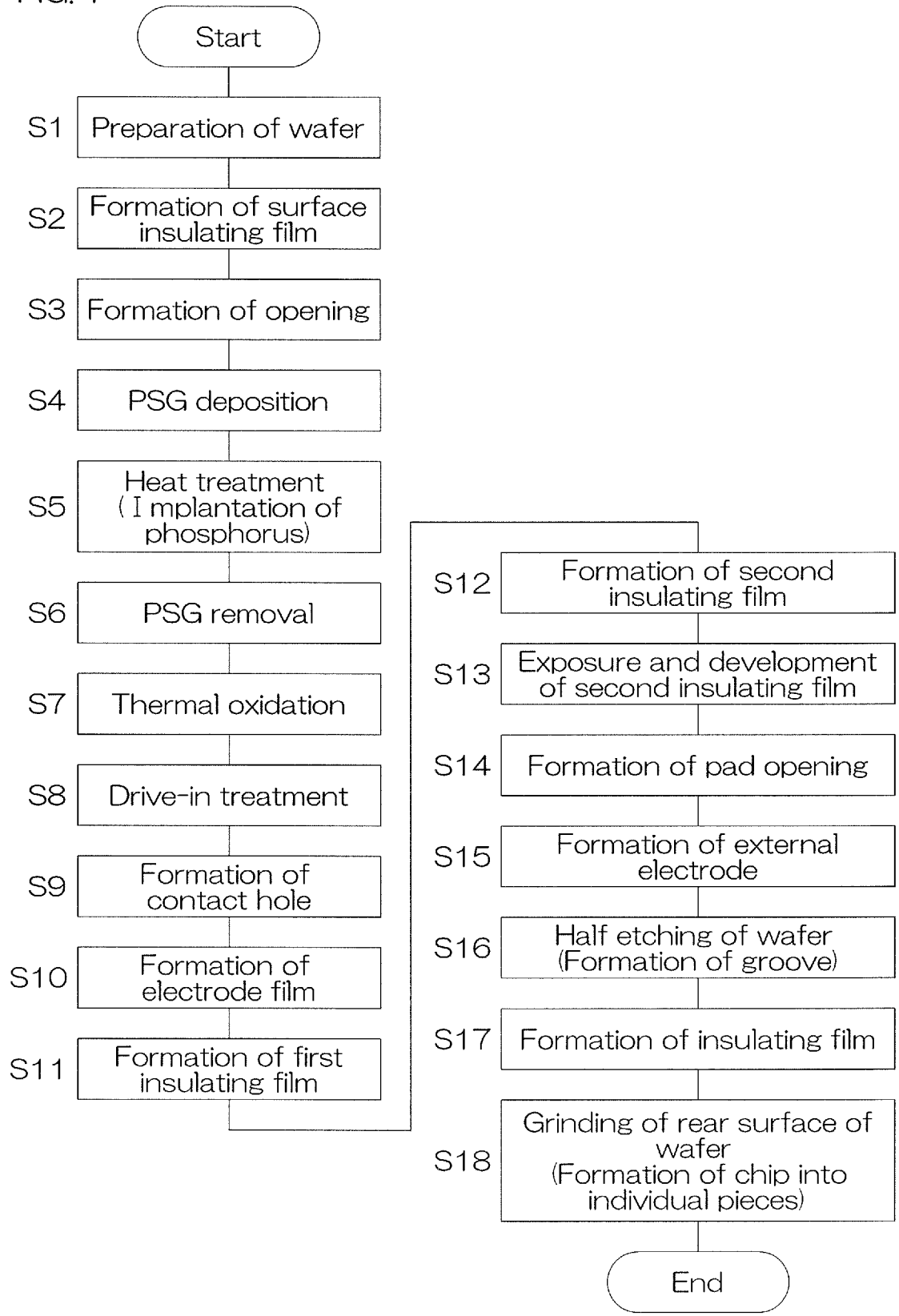
FIG. 7 is a flowchart to describe an example of a manufacturing process of the bidirectional Zener diode of FIG. 1.

FIG. 7 is a flowchart to describe an example of a manufacturing process of the bidirectional Zener diode 1 of FIG. 1. FIG. 8A to FIG. 8H are views of the manufacturing process of the bidirectional Zener diode 1 of FIG. 1 shown in order of process steps.

In order to manufacture the bidirectional Zener diode 1, a single disk-shaped wafer that is a base for the substrate 2 is prepared referring to, for example, FIG. 8A (Step S1). A plurality of chip regions that become the bidirectional Zener diodes 1 are set at the first plane 3 of the wafer. Next, the surface insulating film 13 is formed at the first plane 3 of the wafer by means of, for example, thermal oxidation treatment (Step S2).

Next, referring to FIG. 8B, parts of the surface insulating film 13 that cover regions in which the first and second impurity regions 11 and 12 of the first plane 3 of the wafer are to be formed are selectively removed, and, as a result, a first opening 67 and a second opening 68 are formed (Step S3). The surface insulating film 13 may be removed by, for example, wet etching. This makes it possible to form the side surface 51 of the first opening 67 and the side surface 58 of the second opening 68 as oblique surfaces, respectively.

Figure 8C:
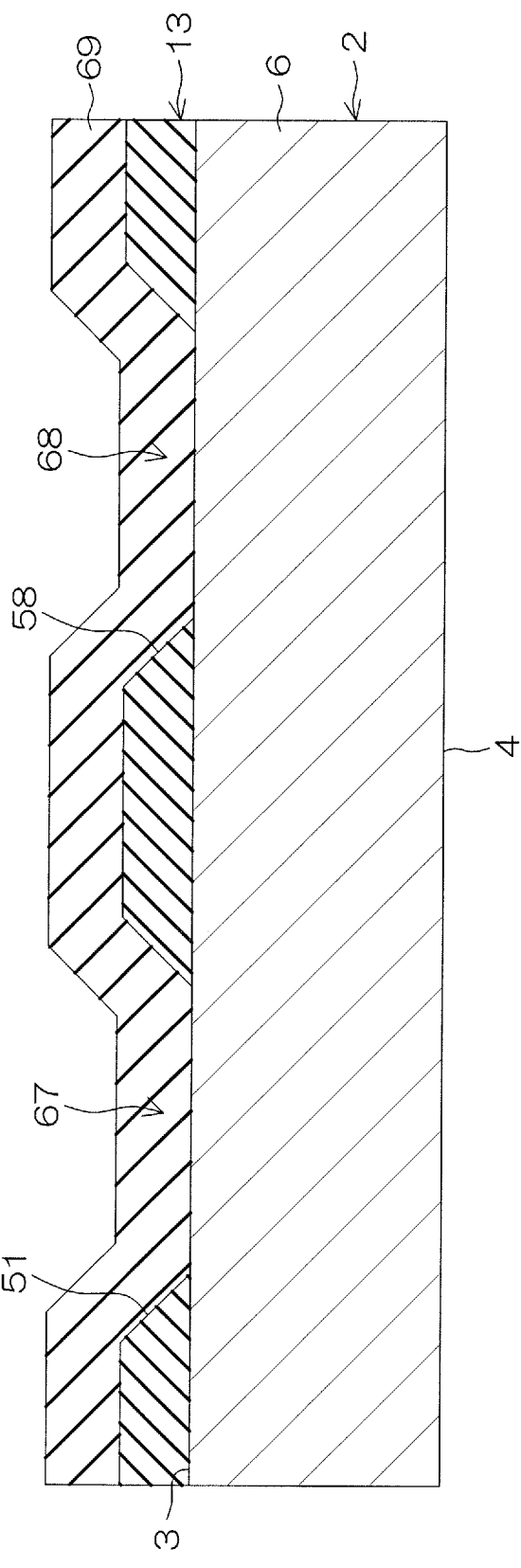

Next, referring to FIG. 8C, an impurity-containing insulating film 69 is deposited on the surface insulating film 13 by means of, for example, a CVD method (Step S4). The impurity-containing insulating film 69 contains an impurity to form the first and second impurity regions 11 and 12, and phosphosilicate glass (PSG) that contains phosphorus that is an n type impurity is used in the present preferred embodiment, and yet other insulating films may be used.

Next, referring to FIG. 8D, heat treatment (for example, 900° C. to 1200° C.) is performed, and, as a result, phosphorus in the impurity-containing insulating film 69 is implanted into the p type substrate 2, and a first impurity region 70 and a second impurity region 71 are formed (Step S5). The first impurity region 70 and the second impurity region 71 each has, for example, a peripheral edge that substantially coincides with a peripheral edge of the first opening 67 and with a peripheral edge of the second opening 68.

Figure 8E:
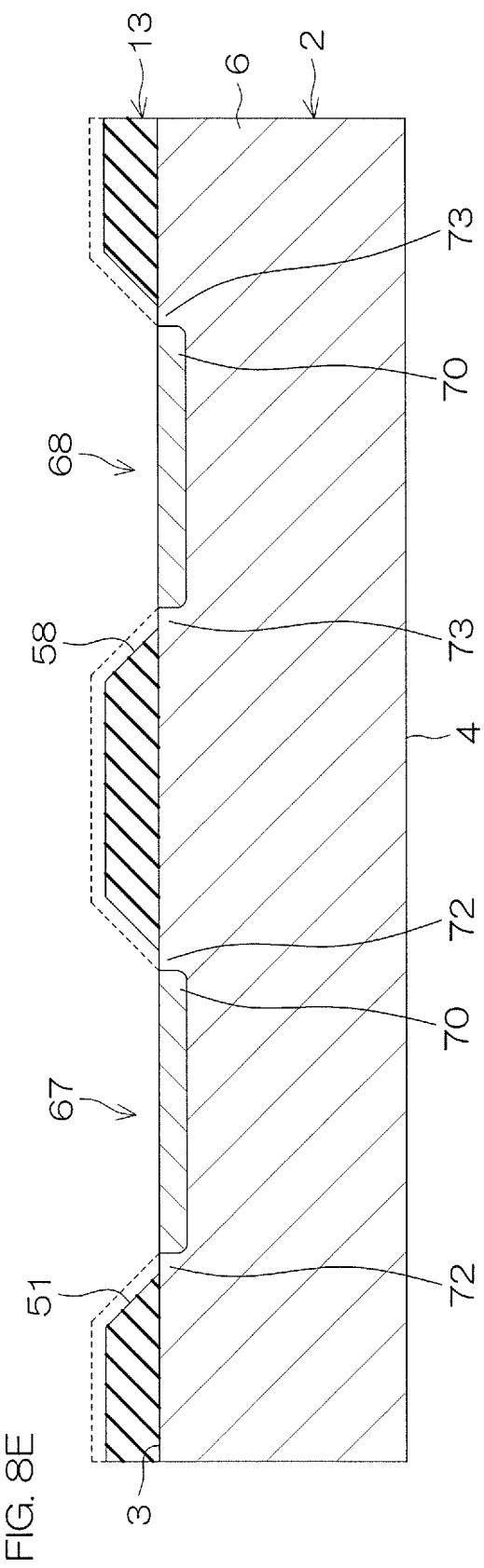

Next, referring to FIG. 8E, the impurity-containing insulating film 69 is removed by, for example, wet etching (Step S6). At this time, a surface layer portion of the surface insulating film 13 that exists under the impurity-containing insulating film 69 is also removed as shown by the broken line in FIG. 8E, and the thickness of the surface insulating film 13 is reduced. As a result of the isotropic removal of the surface insulating film 13, the diameter of the first opening 67 and the diameter of the second opening 68 are also widened, and a portion 72 of the base region 6 is exposed between a peripheral edge of the first opening 67 and a peripheral edge of the first impurity region 70. Likewise, a portion 73 of the base region 6 is exposed between a peripheral edge of the second opening 68 and a peripheral edge of the second impurity region 71.

Next, referring to FIG. 8F, an insulating film (oxide film) is formed by, for example, thermal oxidation treatment at the first plane 3 of the substrate 2 exposed to the first opening 67 and to the second opening 68 (Step S7). This insulating film is formed on upper and lower sides with respect to the first plane 3 of the substrate 2, and hence is brought into a state in which substantially half the insulating film in the thickness direction is buried in the substrate 2. Additionally, in the first plane 3 of the substrate 2, there is an impurity concentration difference between the first and second impurity regions 70 and 71 and the portions 72 and 73 of the base region 6 (the concentration of the first impurity region 70 and the concentration of the second impurity region 71 are relatively high). Therefore, an oxidation reaction in the first and second impurity regions 70 and 71 progresses more rapidly than an oxidation reaction in the portions 72 and 73 of the base region 6. As a result, a thicker insulating film is formed in the first and second impurity regions 70 and 71 than in the portions 72 and 73 of the base region 6. Hence, the first and fourth portions 47 and 54 of the relatively thick surface insulating film 13 and the third and sixth portions 49 and 56 of the relatively thin surface insulating film 13 are formed. The remaining portions of the surface insulating film 13 are the second portion 48 and the fifth portion 55. The first opening 67 and the second opening 68 are closed by thermal oxidation, and, as a result, the concave portion 50 and the concave portion 57 are formed at the position of the first opening 67 and the position of the second opening 68, respectively.

Figure 8G:
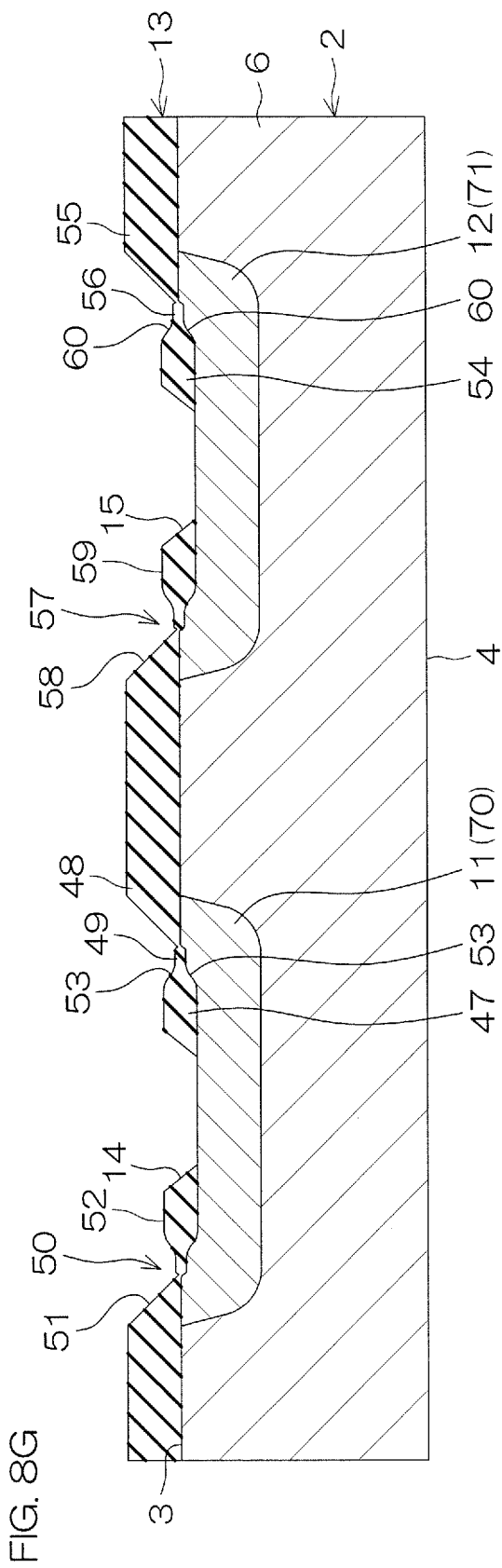

Next, referring to FIG. 8G, heat treatment (drive-in process) to diffuse the n type impurity implanted in the wafer is performed, and the first impurity region 70 and the second impurity region 71 are enlarged, and the first impurity region 11 and the second impurity region 12 are formed (Step S8). Next, the first contact hole 14 that exposes the first impurity region 11 and the second contact hole 15 that exposes the second impurity region 12 are formed in the surface insulating film 13 by means of, for example, etching in which a mask is used (Step S9).

Figure 8H:
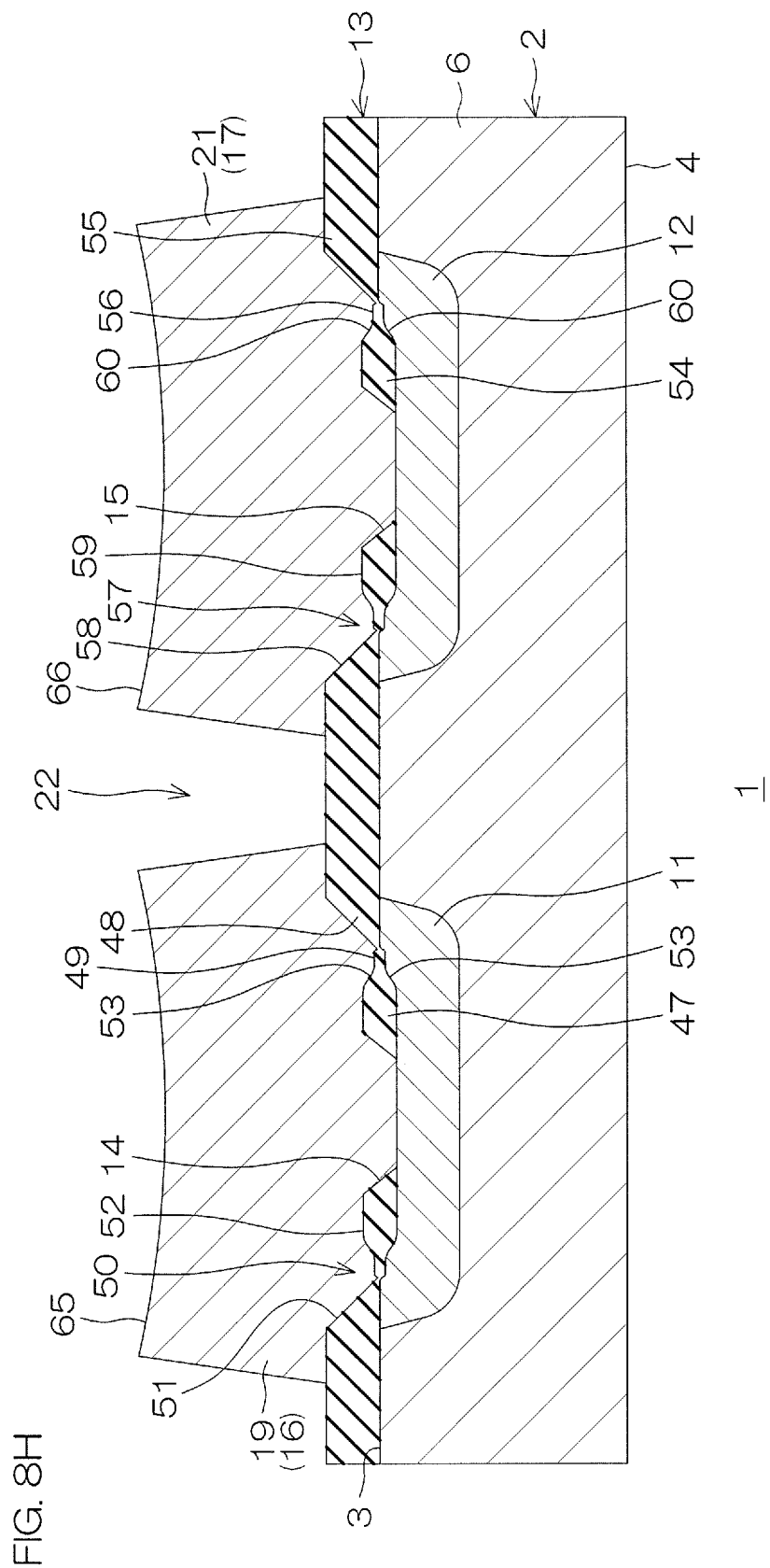

Next, referring to FIG. 8H, an electrode material is deposited so as to cover the surface insulating film 13 by means of, for example, a sputtering method, and an electrode film is formed on the surface insulating film 13 (Step S10). Next, the electrode film is subjected to patterning into a desired shape by means of etching in which a mask is used. Hence, the first electrode film 16 and the second electrode film 17 are formed. Dry etching is employed as the etching.

Next, a nitride film is deposited so as to cover the first electrode film 16 and the second electrode film 17 by means of, for example, the CVD method, and the first insulating film 24 is formed (Step S11). Next, photosensitive polyimide is applied onto the first insulating film 24, and the second insulating film 25 is formed (Step S12). Next, the second insulating film 25 is exposed and developed with patterns corresponding to the first and second openings 26 and 27 (Step S13). Next, the first insulating film 24 is etched while using the second insulating film 25 as a mask, and the first opening 26 and the second opening 27 are formed (Step S14).

Next, an Ni film, a Pd film, and an Au film are subjected to plating deposition in this order so as to fill the first and second openings 26 and 27 therewith, and the first external electrode 7 and the second external electrode 8 are formed (Step S15). Next, a wafer is subjected to half-etching for partitioning into chip regions, and grooves for partitioning into chip regions are formed (Step S16). Next, silicon nitride is deposited on an inner surface of the groove by means of, for example, the CVD method, and the insulating film 46 is formed (Step S17). Next, a rear surface of the wafer is ground until leading to the groove (Step S18). Hence, a plurality of bidirectional Zener diodes 1 are produced as individual pieces, respectively.

As described above, according to the bidirectional Zener diode 1, the slit 22 includes a portion whose aspect ratio is 1 or larger, and therefore a relatively thick electrode film is formed as the first electrode film 16 (first wiring portion 19) and as the second electrode film 17 (second wiring portion 21). This makes it possible to restrict the resistance value of the first electrode film 16 and the resistance value of the second electrode film 17 to a lower value, and makes it possible to allow a large electric current to run through the electrode films 16 and 17. As a result, it is possible to heighten the peak pulse current $I_{pp}$ of the bidirectional Zener diode 1, hence making it possible to achieve excellent peak pulse power $P_{pk}$.

Additionally, the first wiring portion 19 of the first electrode film 16 and the second wiring portion 21 of the second electrode film 17 are each formed in a tapered shape so as to become gradually thinner in proportion to receding from the first pad portion 18 and from the second pad portion 20, respectively. The first wiring portion 19 and the second wiring portion 21 have the maximum widths $W_1$ and $W_2$ in the connection portion 61 connected to the first pad portion 18 and the connection portion 63 connected to the second pad portion 20, respectively. It is possible to allow an electric current from the first pad portion 18 and an electric current from the second pad portion 20 to efficiently flow to the first wiring portion 19 and to the second wiring portion 21 by enlarging the width of the connection portion 61 and the width of the connection portion 63 through which a large electric current flows on the upstream side of an electric current in the first wiring portion 19 and in the second wiring portion 21.

On the other hand, the width becomes smaller toward the tip end portions 62 and 64 (downstream side of an electric current) of the first and second wiring portions 19 and 21, and it is conceivable that the resistance value will become higher, and yet part of the electric current is consumed in the first and second impurity regions 11 and 12 formed halfway during a period during which the electric current flows to the tip end portions 62 and 64. Therefore, the current value is small near the tip end portions 62 and 64, and therefore it is possible to allow the electric current to flow fully efficiently even if the width of the first wiring portion 19 and the width of the second wiring portion 21 are narrow.

In other words, in the bidirectional Zener diode 1, the first wiring portion 19 and the second wiring portion 21 that engage each other in a comb-teeth manner are each formed in a tapered shape, and therefore it is possible to efficiently form the first electrode film 16 and the second electrode film 17 while effectively using the space of the substrate 2 that is limited in magnitude, and it is also possible to allow an electric current to flow efficiently.

Figure 9:
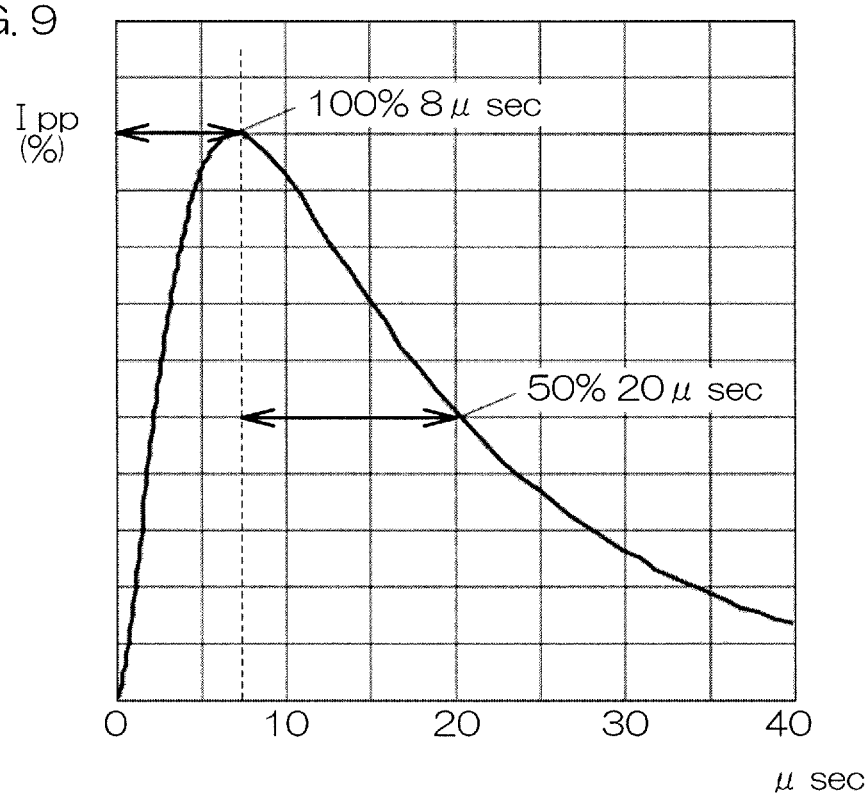
FIG. 9 is a view showing a current surge waveform in a surge immunity test.
Figure 10:
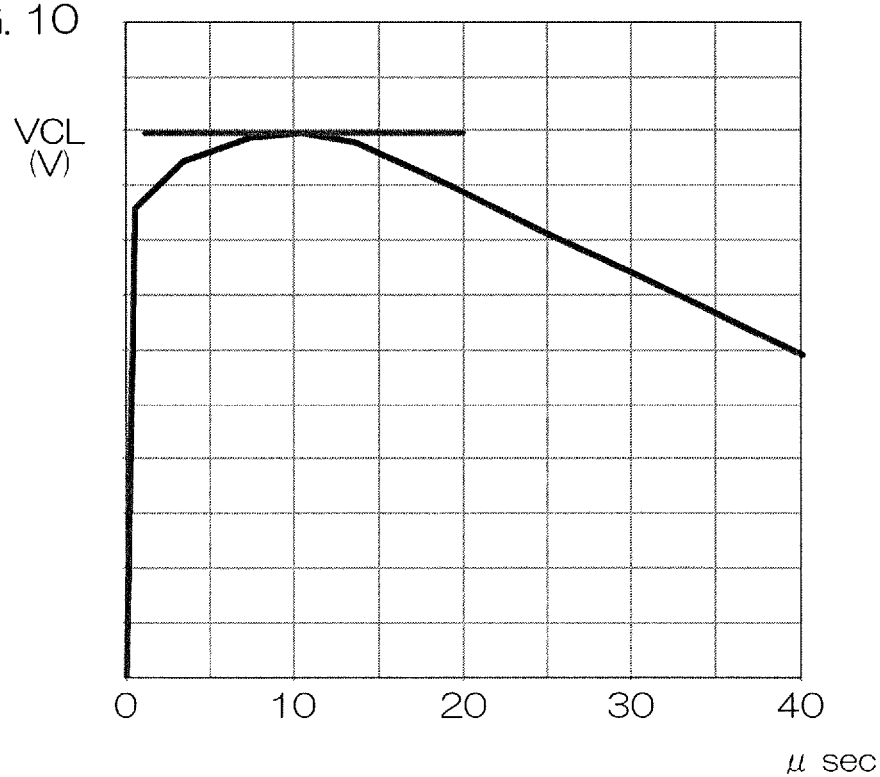
FIG. 10 is a view showing a current surge waveform in a surge immunity test.
Figure 11:
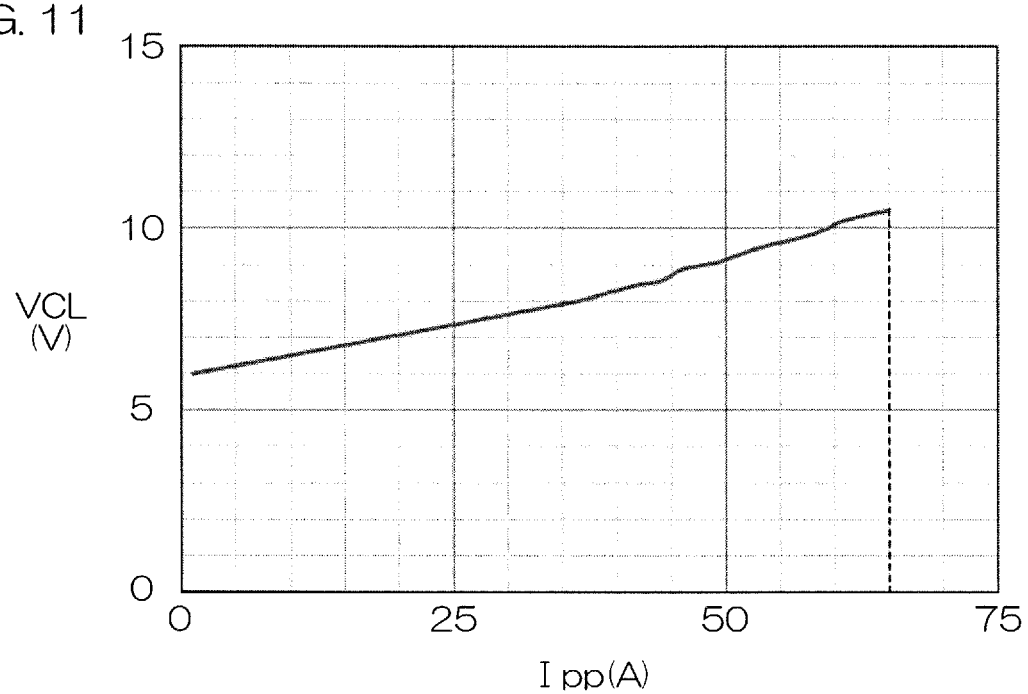
FIG. 11 is a view showing a relationship between a peak pulse current ($I_{pp}$) and a clamping voltage ($V_{CL}$).

Next, with respect to the structure of the above-described bidirectional Zener diode 1, surge immunity tests were performed in conformity to IEC61000-4-5, and the results are shown in FIGS. 9 to 11. It has been understood from the results of FIGS. 9 to 11 that the bidirectional Zener diode 1 is capable of achieving a large peak pulse current $I_{pp}$ of 65A and is capable of achieving excellent peak pulse power $P_{pk}$.

Although the preferred embodiment of the present invention has been described as above, the present invention can be embodied in other modes.

For example, in the aforementioned preferred embodiment, the conductivity type of the base region 6 (substrate 2) and each conductivity type of the first and second impurity regions 11 and 12 may be reversed. In other words, the p type portion may be changed into an n type portion, and the n type portion may be changed into a p type portion.

Figure 12:
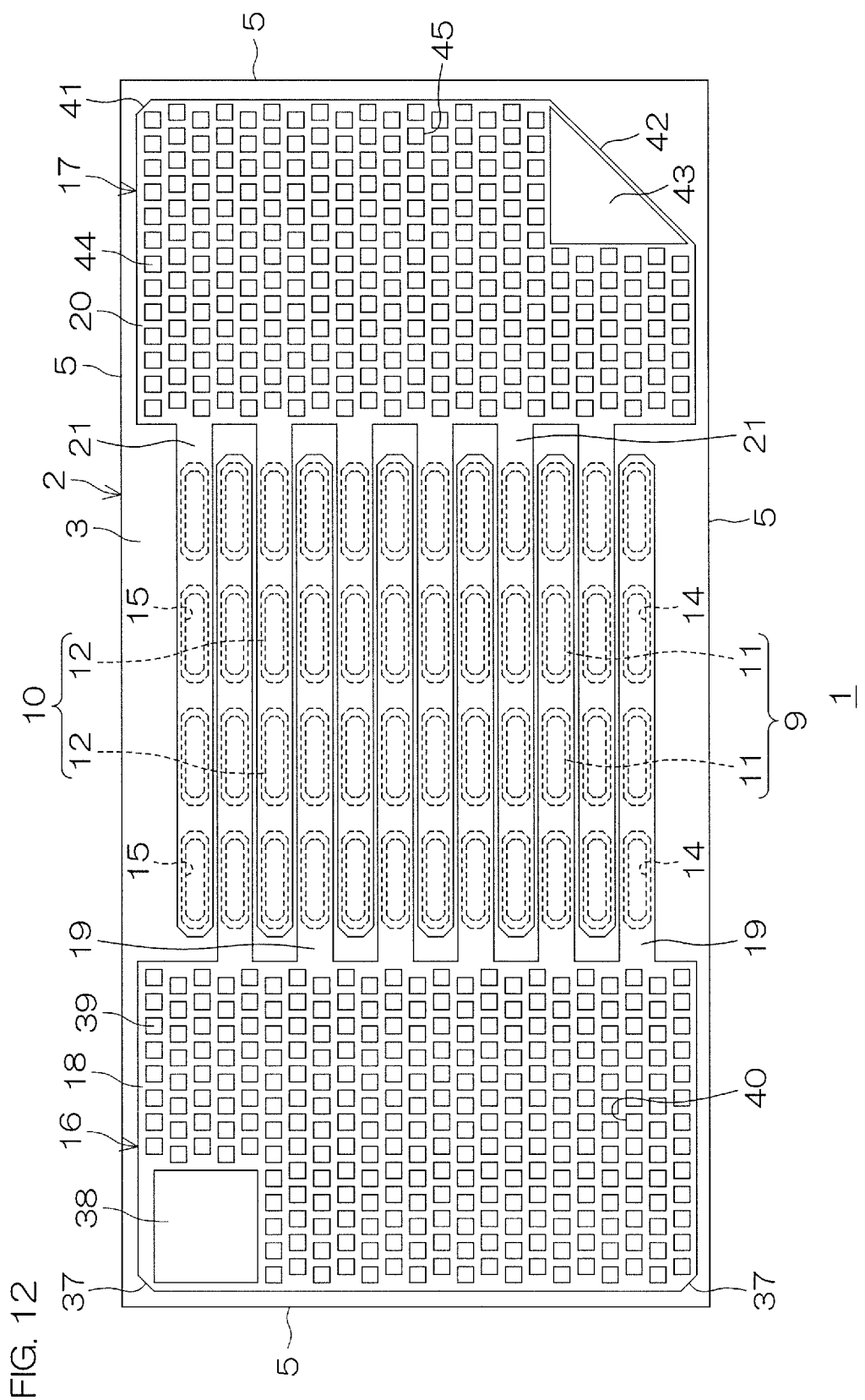
FIG. 12 is a view showing a modification of the bidirectional Zener diode of FIG. 1.
Figure 13:
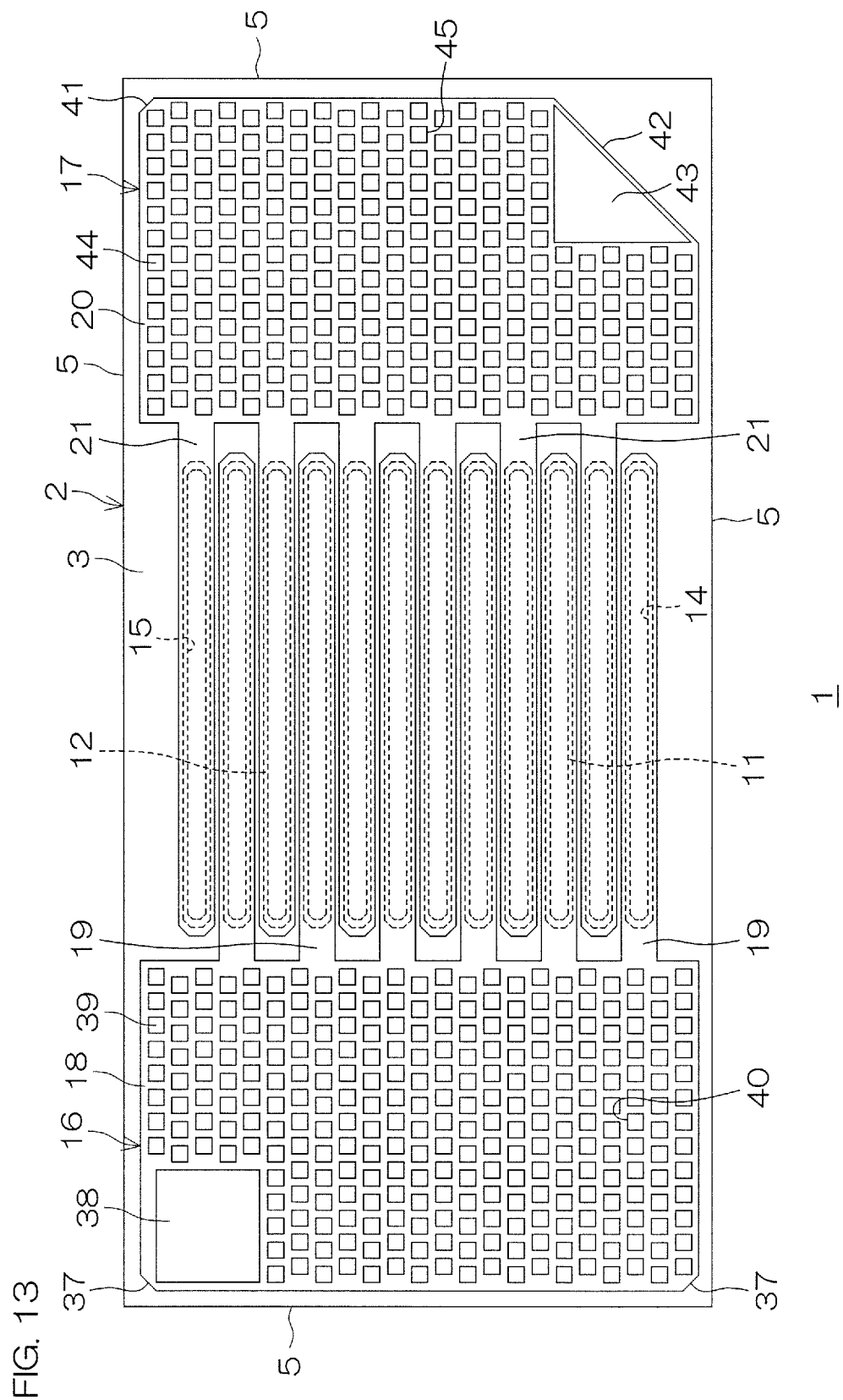
FIG. 13 is a view showing a modification of the bidirectional Zener diode of FIG. 1.

Although only the 12-row×2-column matrix is shown as an example of the sequence pattern of each of the first and second impurity regions 11 and 12 as described in the aforementioned preferred embodiment, a sequence pattern whose column number is greater than in FIG. 4 (for example, a 12-row×4-column matrix) may be employed with reference to, for example, FIG. 12. Additionally, the first impurity region 11 and the second impurity region 12 may be arrayed in a stripe manner as a whole by allowing the first impurity region 11 and the second impurity region 12 to be formed one by one with respect to one first wiring portion 19 and one second wiring portion 21, respectively, with reference to FIG. 13.

Figure 14:
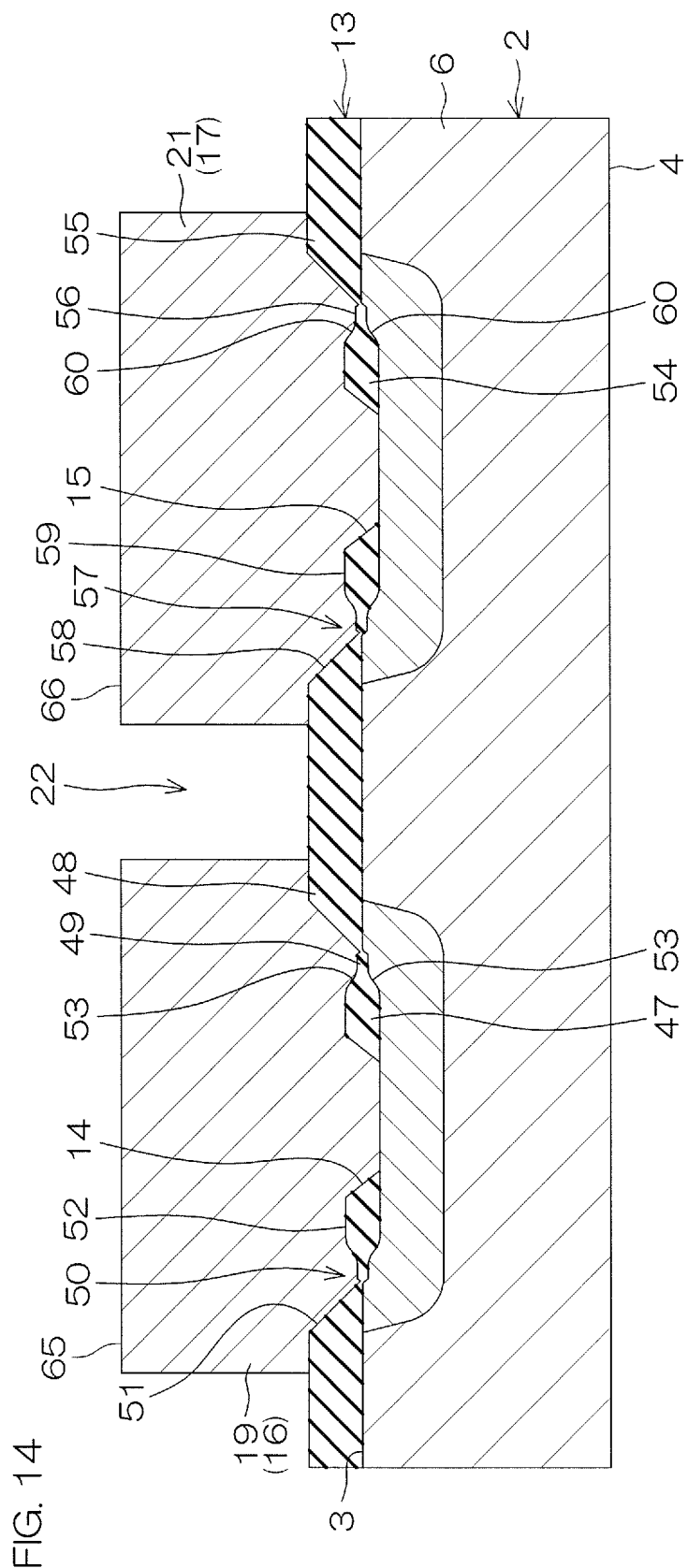
FIG. 14 is a view showing a modification of the bidirectional Zener diode of FIG. 1.

Additionally, the upper surfaces 65 and 66 of the first and second wiring portions 19 and 21 are not necessarily required to be curved, and may be flat with reference to FIG. 14.

The bidirectional Zener diode 1 shown in the aforementioned preferred embodiment can be incorporated into, for example, electronic devices, mobile terminals such as portable electronics, robots, drones, etc., as a circuit component for power supply circuits, for high frequency circuits, for digital circuits, and so on.

Besides, various design changes can be made within the scope of matters mentioned in the claims.

What is claimed is:
1. A bidirectional Zener diode comprising:
   a substrate;
   a first conductivity type base region formed at a front surface of the substrate;
   a second conductivity type first impurity region formed at the base region;
   a second conductivity type second impurity region formed at the base region away from the first impurity region;
   an insulating layer formed on the front surface of the substrate;
   a first electrode film formed on the insulating layer and electrically connected to the first impurity region, the first electrode film including a first wiring portion having a first upper surface;

a second electrode film formed on the insulating layer and electrically connected to the second impurity region, the second electrode film including a second wiring portion having a second upper surface; and a first region formed on the insulating layer, the first region being sandwiched between the first electrode film and the second electrode film, and the first region including a portion having an aspect ratio of 1 or larger, wherein at least one of the first wiring portion and the second wiring portion is formed in a tapered shape so as to become gradually thinner toward a tip end portion thereof, and at least one of the first upper surface and the second upper surface is a curved upper surface that is concaved toward the insulating layer.

2. The bidirectional Zener diode according to claim 1, wherein the first electrode film includes a first pad portion disposed away from the first impurity region in a first direction along the front surface of the substrate, the first wiring portion extends from the first pad portion to a region on the first impurity region, and the first wiring portion has a largest first width in a first connection portion connected to the first pad portion.

3. The bidirectional Zener diode according to claim 2, wherein the first wiring portion is formed in a tapered shape so as to become gradually thinner toward a tip end portion of the first wiring portion from the first connection portion connected to the first pad portion.

4. The bidirectional Zener diode according to claim 3, wherein the largest first width in the first connection portion connected to the first pad portion of the first wiring portion is twice or more a width of the tip end portion of the first wiring portion.

5. The bidirectional Zener diode according to claim 2, wherein the second electrode film includes a second pad portion disposed away from the second impurity region in the first direction the second wiring portion extends from the second pad portion to a region on the second impurity region, and the second wiring portion has a largest second width in a second connection portion connected to the second pad portion.

6. The bidirectional Zener diode according to claim 5, wherein the second wiring portion is formed in a tapered shape so as to become gradually thinner toward a tip end portion of the second wiring portion from the second connection portion.

7. The bidirectional Zener diode according to claim 6, wherein the largest second width in the second connection portion is twice or more a width of the tip end portion of the second wiring portion.

8. The bidirectional Zener diode according to claim 1, wherein a thickness of the first electrode film and a thickness of the second electrode film are each 3 µm to 5 µm, and a distance between the first electrode film and the second electrode film in the portion having the aspect ratio of the first region is 0.5 µm to 5 µm.

9. The bidirectional Zener diode according to claim 1, wherein the first electrode film and the second electrode film are each made of AlCu.

10. The bidirectional Zener diode according to claim 1, wherein the insulating layer has a first contact hole that exposes the first impurity region, and the first electrode film is connected to the first impurity region through the first contact hole, and the insulating layer includes a first portion that has a first thickness and that forms the first contact hole and a second portion that surrounds the first portion and that has a second thickness larger than the first thickness.

11. The bidirectional Zener diode according to claim 10, wherein the insulating layer includes a third portion that is formed between the first portion and the second portion and that has a third thickness smaller than the first thickness.

12. The bidirectional Zener diode according to claim 10, wherein the insulating layer has a second contact hole that exposes the second impurity region, and the second electrode film is connected to the second impurity region through the second contact hole, and the insulating layer includes a fourth portion that has a fourth thickness and that forms the second contact hole and a fifth portion that surrounds the fourth portion and that has a fifth thickness larger than the fourth thickness.

13. The bidirectional Zener diode according to claim 12, wherein the insulating layer includes a sixth portion that is formed between the fourth portion and the fifth portion and that has a sixth thickness smaller than the fourth thickness.

14. The bidirectional Zener diode according to claim 1, wherein a plurality of the first impurity regions and a plurality of the second impurity regions are alternately arrayed along a predetermined array direction.

15. The bidirectional Zener diode according to claim 1, further comprising:

a first external electrode that is connected to the first electrode film and that has a front surface including a plurality of first convex portions partitioned by a first groove; and a second external electrode that is connected to the second electrode film and that has a front surface including a plurality of second convex portions partitioned by a second groove.

16. The bidirectional Zener diode according to claim 15, wherein the plurality of first convex portions and the plurality of second convex portions are each arrayed in a staggered manner.

* * * * *